US012648136B2

(12) United States Patent
Ong

(10) Patent No.: US 12,648,136 B2
(45) Date of Patent: Jun. 2, 2026

(54) POWER SUPPLYING CIRCUIT AND ASSOCIATED SWITCH CONTROLLER FOR NON-VOLATILE MEMORY

(71) Applicant: eMemory Technology Inc., Hsin-Chu (TW)

(72) Inventor: Wei-Chiang Ong, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 131 days.

(21) Appl. No.: 18/892,600

(22) Filed: Sep. 23, 2024

(65) Prior Publication Data

US 2025/0157545 A1     May 15, 2025

Related U.S. Application Data

(60) Provisional application No. 63/598,558, filed on Nov. 14, 2023.

(51) Int. Cl.
| | |
|---|---|
| *G11C 16/16* | (2006.01) |
| *G11C 16/26* | (2006.01) |
| *G11C 16/30* | (2006.01) |
| *G11C 16/34* | (2006.01) |
| *H03K 19/0185* | (2006.01) |
| *H10B 41/35* | (2023.01) |
| *H10B 41/60* | (2023.01) |
| *H10D 30/68* | (2025.01) |
| *G11C 5/14* | (2006.01) |

(52) U.S. Cl.
CPC ............. *H10B 41/60* (2023.02); *G11C 16/16* (2013.01); *G11C 16/26* (2013.01); *G11C 16/30* (2013.01); *G11C 16/3459* (2013.01); *H03K*

*19/018521* (2013.01); *H10B 41/35* (2023.02); *H10D 30/685* (2025.01); *H10D 30/6892* (2025.01); *G11C 5/145* (2013.01)

(58) Field of Classification Search
CPC ..... G11C 16/0433; G11C 16/14; G11C 16/16; G11C 16/26; G11C 16/30; G11C 16/3459; G11C 5/145; H03K 19/018521; H10B 41/30; H10B 41/35; H10B 41/60
See application file for complete search history.

(56) References Cited

U.S. PATENT DOCUMENTS

| | | | |
|---|---|---|---|
| 11,690,121 B2 | 6/2023 | Cai et al. | |
| 12,420,826 B1 * | 9/2025 | Sutarwala | ................. B60L 3/04 |
| 2015/0175099 A1 * | 6/2015 | Puzenat | ............. B60R 16/0231 |
| | | | 701/22 |
| 2016/0099715 A1 | 4/2016 | Kawasaki | |
| 2023/0115601 A1 * | 4/2023 | Hsieh | .................... H03M 1/468 |
| | | | 341/118 |

* cited by examiner

*Primary Examiner* — Yong J Choe
(74) *Attorney, Agent, or Firm* — WPAT, PC

(57) ABSTRACT

A power supplying circuit and an associated switch controller for a non-volatile memory are provided. When the sector erase is performed, the voltage stress withstood by the switching transistors in the power supplying circuit is lower than the maximum voltage stress. In addition, the voltage stress withstood by all transistors in the switch controller is lower than the maximum voltage stress. In other words, when the sector erase is performed, all switch controllers and all switching transistors in the power supplying circuit can be operated normally. In addition, an erase voltage is provided to a specified sector of the array structure, so that all memory cells in the specified sector are erased into the erase state.

22 Claims, 8 Drawing Sheets

260

| | PH$_{LOGIC}$ | PH$_{TRN}$ | PH$_{ERS}$ |
|---|---|---|---|
| V$_H$ | V$_{DD}$ | 8V | V$_{EE}$(16V) |
| V$_M$ | V$_{DD}$ | 4V | 8V |
| V$_L$ | 0V | 0V | 8V |

281

262

POWER SUPPLYING CIRCUIT AND ASSOCIATED SWITCH CONTROLLER FOR NON-VOLATILE MEMORY

This application claims the benefit of U.S. provisional application Ser. No. 63/598,558, filed Nov. 14, 2023, the subject matters of which is incorporated herein by reference.

FIELD OF THE INVENTION

The present invention relates to a circuit of a non-volatile memory, and more particularly to a power supplying circuit and an associated switch controller for a non-volatile memory.

BACKGROUND OF THE INVENTION

FIG. 1A is a schematic circuit diagram illustrating a circuitry structure of a conventional non-volatile memory cell 10. Hereinafter, the non-volatile memory cell is also referred to as a memory cell. The memory cell 10 comprises a select transistor $M_S$, a floating gate transistor $M_F$ and a capacitor C. Since the memory cell 10 comprises two transistors and one capacitor, the memory cell 10 is referred as a 2T1C cell. The source terminal of the select transistor $M_S$ is connected with a source line SL. The gate terminal of the select transistor $M_S$ is connected with a word line WL. The source terminal of the floating gate transistor $M_F$ is connected with the drain terminal of the select transistor $M_S$. The drain terminal of the floating gate transistor $M_F$ is connected with a bit line BL. A first terminal of the capacitor C is connected with a floating gate 12 of the floating gate transistor $M_F$. A second terminal of the capacitor C is connected with an erase line EL.

By providing appropriate bias voltages to the source line SL, the word line WL, the bit line BL and the erase line EL, a program action, an erase action or a read action is selectively performed on the memory cell 10. For example, when the erase action is performed on the memory cell 10, the source line SL, the word line WL, and the bit line BL receive a ground voltage (0V), and the erase line EL receives an erase voltage $V_{EE}$. Consequently, the electrons stored in the floating gate transistor $M_F$ will be ejected from the floating gate 12 to the erase line EL through the capacitor C. Under this circumstance, the memory cell is in an erase state.

When a program voltage $V_{PP}$ is provided to the memory cell 10, the program action is performed on the memory cell 10. When a read voltage $V_{RD}$ is provided to the memory cell 10, the read action is performed on the memory cell. Generally, the erase voltage $V_{EE}$ is higher than the program voltage $V_{PP}$, and the program voltage $V_{PP}$ is higher than the read voltage $V_{RD}$. For example, the erase voltage $V_{EE}$ is 16V, the program voltage $V_{PP}$ is 7V, and the read voltage $V_{RD}$ is 1.2V.

The circuitry structure of the memory cell 10 is not restricted to the circuitry structure shown in FIG. 1A. That is, the program action, the erase action or the read action is selectively performed on the memory cell with another circuitry structure.

FIG. 1B is a schematic circuit diagram illustrating the architecture of a non-volatile memory 100. The non-volatile memory 100 comprises an array structure 110, a word line driver 120, a bit line driver 130, a sensing circuit 140, a processing unit 150 and a power supplying circuit 160.

The array structure 110 comprises M×N memory cells. The structures of these memory cells are identical to the structure of the memory cell 10 shown in FIG. 1A. The M×N memory cells are connected with the source line SL. The N memory cells in the first row of the array structure 110 are connected with the word line $WL_1$. The N memory cells in the first row are respectively connected with the corresponding N bit lines $BL_1 \sim BL_N$. The N memory cells in the second row of the array structure 110 are connected with the word line $WL_2$. The N memory cells in the second row are respectively connected with the corresponding N bit lines $BL_1 \sim BL_N$. The rest may be deduced by analogy. The M memory cells in the M-th row of the array structure 110 are connected with the word line $WL_M$. The N memory cells in the M-th row are respectively connected with the corresponding N bit lines $BL_1 \sim BL_N$.

The array structure 110 is further divided into X sectors. The memory cells in the X sectors are connected with the corresponding erase lines $EL_1 \sim EL_X$, respectively. For example, each sector contains two rows of memory cells (i.e., 2×N memory cells), and X=M/2. That is, in the array structure 110, the first sector $SE_1$ contains the N memory cells in the first row and the N memory cells in the second row (i.e., 2×N memory cells), and the 2×N memory cells in the first sector $SE_1$ are connected with the erase line $EL_1$. Similarly, the second sector $SE_2$ contains the N memory cells in the third row and the N memory cells in the fourth row (i.e., 2×N memory cells), and the 2×N memory cells in the second sector $SE_2$ are connected with the erase line $EL_2$. The rest may be deduced by analogy. Similarly, the X-th sector $SE_X$ contains the N memory cells in the (M−1)-th row and the N memory cells in the M-th row (i.e., 2×N memory cells), and the 2×N memory cells in the X-th sector $SE_X$ are connected with the erase line $EL_X$.

The processing unit 150 is connected with a host (not shown). The processing unit 150 receives from the host a command CMD instructing the non-volatile memory 100 to perform the read, program or erase action. According to the command CMD, the processing unit 150 generates a driving signal $D_{RV}$ and a control signal set Ctrl.

The word line driver 120 and the bit line driver 130 receive the driving signal $D_{RV}$. The word line driver 120 is connected with the word lines $WL_1 \sim WL_M$. The bit line driver 130 is connected with the bit lines $BL_1 \sim BL_N$. According to the driving signal $D_{RV}$, the word line driver 120 and the bit line driver 130 activate the corresponding word line and the corresponding bit line. The sensing circuit 140 is connected with the bit line driver 130. When the read action is performed on a specified memory cell in the memory cell array 110, the sensing circuit 140 outputs a read data Da.

The power supplying circuit 160 receives the control signal set Ctrl and generates appropriate voltages to the source line SL and the erase lines $EL_1 \sim EL_X$ according to the control signal set Ctrl. For example, when the program action is performed, the power supplying circuit 160 provides the program voltage $V_{PP}$. When the read action is performed, the power supplying circuit 160 provides the read voltage $V_{RD}$. When the erase action is performed, the power supplying circuit 160 provides the erase voltage $V_{EE}$. Generally, the erase voltage $V_{EE}$ is the maximum voltage inside the non-volatile memory 100.

For example, the processing unit 150 receives the command CMD from the host to erase all of the memory cells in the first sector $SE_1$. The command CMD contains an address signal to indicate a specified sector in the array structure 110. In addition, this action is referred as a sector erase.

That is, the processing unit 150 generates the control signal set Ctrl to the power supplying circuit 160 according to the received command CMD. Consequently, the power supplying circuit 160 provides the erase voltage $V_{EE}$ to the erase line $EL_1$, and the power supplying circuit 160 does not provide the erase voltage $V_{EE}$ to other erase lines $EL_2 \sim EL_X$. Of course, the power supplying circuit 160 provides the ground voltage (0V) to the source line SL. In addition, the processing unit 150 generates the driving signal $D_{RV}$ to the word line driver 120 and the bit line driver 130. Consequently, the word line driver 120 provides the ground voltage (0V) to the word lines $WL_1 \sim WL_M$, and the bit line driver 130 provides the ground voltage (0V) to the bit lines $BL_1 \sim BL_N$. Since the power supplying circuit 160 provides the erase voltage $V_{EE}$ to the erase line $EL_1$, all of the memory cells in the first sector $SE_1$ are erased to the erase state when the erase voltage $V_{EE}$ is received. Consequently, the sector erase is completed. Moreover, since the power supplying circuit 160 does not provide the erase voltage $V_{EE}$ to other erase lines $EL_2 \sim EL_X$, the other sectors $SE_2 \sim SE_X$ are not subjected to the sector erase.

FIG. 1C is a schematic circuit diagram of the power supplying circuit 160 in the non-volatile memory 100 shown in FIG. 1B. For example, the power supplying circuit 160 provides the erase voltage $V_{EE}$. As shown in FIG. 1C, the power supplying circuit 160 comprises a voltage source 162 and a switching circuit 166. The switching circuit 166 is connected with the voltage source 162 and the erase lines $EL_1 \sim EL_X$. In addition, the voltage source 162 generates the erase voltage $V_{EE}$. The control signal set Ctrl contains X control signals $Ctrl_1 \sim Ctrl_X$.

The switching circuit 166 comprises X power paths 171~17X. These power paths 171~17X are controlled according to the X control signals $Ctrl_1 \sim Ctrl_X$. The X power paths 171~17X comprise respective power switches. The power switches are P-type switching transistors $M_{SW1} \sim M_{SWX}$. The first terminals of the X switching transistors $M_{SW1} \sim M_{SWX}$ are connected with the output terminal of the voltage source 162. The second terminals of the X switching transistors $M_{SW1} \sim M_{SWX}$ are coupled to the corresponding erase lines $EL_1 \sim EL_X$, respectively. The control terminals of the switching transistors $M_{SW1} \sim M_{SWX}$ receive the corresponding control signals $Ctrl_1 \sim Ctrl_X$, respectively. In other words, the plural power paths 171~17X are constituted by the X switching transistors $M_{SW1} \sim M_{SWX}$, respectively. In addition, the on/off states of the power path 171~17X are controlled according to the control signal set Ctrl. In case that one of the power paths 171~17X is turned on, the erase voltage $V_{EE}$ is transmitted to the corresponding erase line. Of course, in some cases, the power switches are N-type switching transistors.

In addition to the power paths 171~17X, the switching circuit 166 may be equipped with other power paths (not shown) for transmitting the program voltage $V_{PP}$ and the read voltage $V_{RD}$. When the program action, the read action or the erase action is performed, appropriate voltages (e.g., the program voltage $V_{PP}$, the read voltage $V_{RD}$ or the erase voltage $V_{EE}$) can be provided to the source line SL and the erase lines $EL_1 \sim EL_X$.

For example, when the first sector $SE_1$ in the array structure 110 of the non-volatile memory 100 is subjected to the sector erase, the processing unit 150 will activate the control signal $Ctrl_1$ in the control signal set Ctrl but not activate other control signals $Ctrl_2 \sim Ctrl_X$. Under this circumstance, the switching transistor $M_{SW1}$ is turned on, and the power path 171 is turned on. Consequently, the erase voltage $V_{EE}$ is transmitted to the erase line $EL_1$ through the power path 171. The other switching transistors $M_{SW2} \sim M_{SWX}$ are turned off, and the power paths 172~17X are turned off. Consequently, the erase voltage $V_{EE}$ cannot be transmitted to the erase lines $EL_2 \sim EL_X$. Meanwhile, in the non-volatile memory 100, all memory cells in the first sector $SE_1$ are erased into the erase state, but the memory cells in the other sectors $SE_2 \sim SE_X$ are not erased into the erase state.

Generally, the signals in the control signal set Ctrl from the processing unit 150 are logic signals. The logic high level of each logic signal is equal to a logic supply voltage $V_{DD}$. The logic low level of each logic signal is equal to the ground voltage (0V). For example, the logic supply voltage $V_{DD}$ is approximately in the range between 1.2 V and 3.3 V. In addition, the maximum voltage stress that the switching transistors $M_{SW1} \sim M_{SWX}$ can withstand is about 8.5 V.

As mentioned above, the erase voltage $V_{EE}$ is 16 V. When the control signal $Ctrl_1$ is activated, the control signal $Ctrl_1$ is in the logic low level state (0V), and the voltage stress between the source terminal and the gate terminal of the switching transistor $M_{SW1}$ is 16 V. This voltage stress will damage the switching transistor $M_{SW1}$. Similarly, when the control signal $Ctrl_2$ is not activated, the control signal $Ctrl_2$ is in the logic high level state (e.g., 3.3V), and the voltage stress between the source terminal and the gate terminal of the switching transistor $M_{SW2}$ is 12.7 V. This voltage stress will also damage the switching transistor $M_{SW2}$.

SUMMARY OF THE INVENTION

An embodiment of the present invention provides a power supplying circuit for a non-volatile memory. The power supplying circuit includes a voltage source and a switching circuit. The voltage source outputs a high voltage, a low voltage and a decoupling signal. The switching circuit includes a power switch and a switch controller. A first terminal of the power switch receives the high voltage. A second terminal of the power switch is coupled to an erase line of the non-volatile memory. The switch controller includes a latch, a first driving stage, a first control stage and a second control stage. A first power terminal of the latch receives the high voltage. A second power terminal of the latch receives the low voltage. A first control terminal of the latch is connected with a first node. A second control terminal of the latch is connected with a second node. A first power terminal of the first driving stage receives the high voltage. A second power terminal of the first driving stage receives the low voltage. An input terminal of the first driving stage is connected with the first node. An output terminal of the first driving stage generates a switching signal to a control terminal of the power switch. In addition, the on/off states of the power switch are controlled according to the switching signal. The first control stage is connected with the first node. The first control stage receives a control signal and the decoupling signal. The second control stage is connected with the second node. The second control stage receives an inverted control signal and the decoupling signal. In a logic phase of a sector erase, the high voltage is equal to a logic supply voltage, the low voltage is equal to a ground voltage and the control signal is stored in the latch. In a transition phase of the sector erase, the high voltage rises from the logic supply voltage to a first voltage, the low voltage is equal to the ground voltage. In an erase phase of the sector erase, the high voltage rises from the first voltage to an erase voltage, the low voltage rises from the ground voltage to a second voltage, the erase voltage is higher than the second voltage, and the latch and the first driving stage generates the switching signal according to the high voltage and the low voltage. The decoupling signal is in a range of the high voltage and the low voltage during the logic phase, the transition phase and the erase phase.

Another embodiment of the present invention provides a power supplying circuit for a non-volatile memory. The power supplying circuit includes a power switch, a switch controller and a voltage source. The voltage source outputs a high voltage, a low voltage and a decoupling signal. A first terminal of the power switch receives the high voltage. A second terminal of the power switch is coupled to an erase line of the non-volatile memory. The switch controller receives the high voltage, the low voltage and the decoupling signal. The switch controller includes a latch, a first driving stage, a first control stage and a second control stage. A first control terminal of the latch is coupled to a first node. A second control terminal of the latch is coupled to a second node. The first driving stage is coupled to the first node and a control terminal of the power switch, and outputs the high voltage or the low voltage as a switching signal to the control terminal of the power switch according to a voltage at the first node. The first control stage is coupled to the first node, and controls the voltage at the first node according to a control signal and the decoupling signal. The second control stage is coupled to the second node, and controls a voltage at the second node according to an inverted control signal and the decoupling signal. The high voltage, the low voltage and the decoupling signal are increased in a multi-step manner during a sector erase of the non-volatile memory. The decoupling signal is in a range of the high voltage and the low voltage during the sector erase.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figures 1A, 1B, 1C:
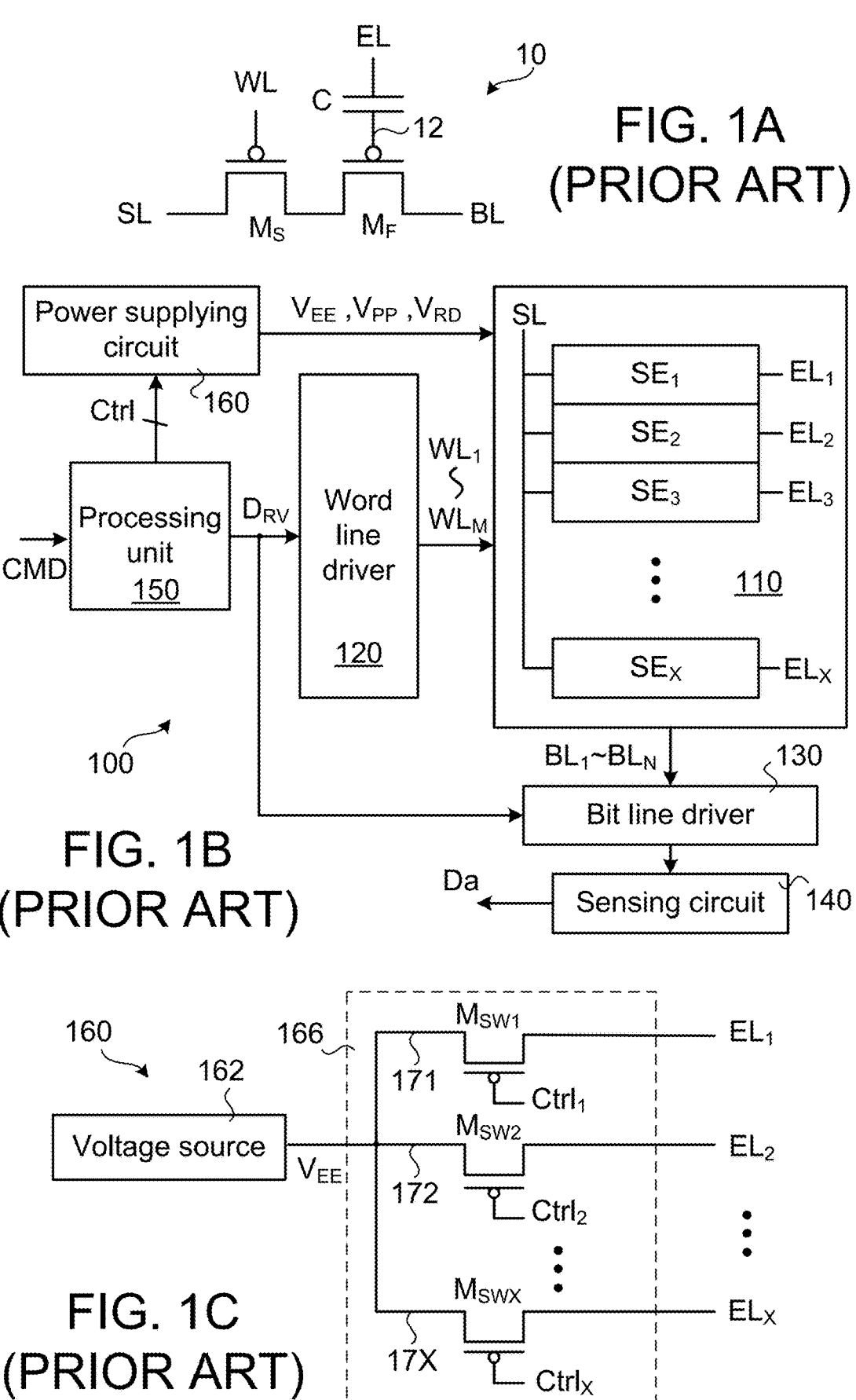
FIG. 1A (prior art) is a schematic circuit diagram illustrating a circuitry structure of a conventional non-volatile memory cell.
FIG. 1B (prior art) is a schematic circuit diagram illustrating the architecture of a non-volatile memory.
FIG. 1C (prior art) is a schematic circuit diagram of the power supplying circuit in the non-volatile memory shown in FIG. 1B.

The present invention provides a power supplying circuit and an associated switch controller for a non-volatile memory. The power supplying circuit of the present invention can be used to replace the power supplying circuit 160 shown in FIG. 1B. The power supplying circuit comprises plural switch controllers for controlling the power switches. Consequently, all power switches can be operated normally within the safe operating area (SOA). Since the switch controller also receives the high voltage, the present invention provides a multi-step power-up control method to control the switch controller. Consequently, the electronic components in the switch controller can also be operated normally within the SOA.

Figures 2A, 2B:
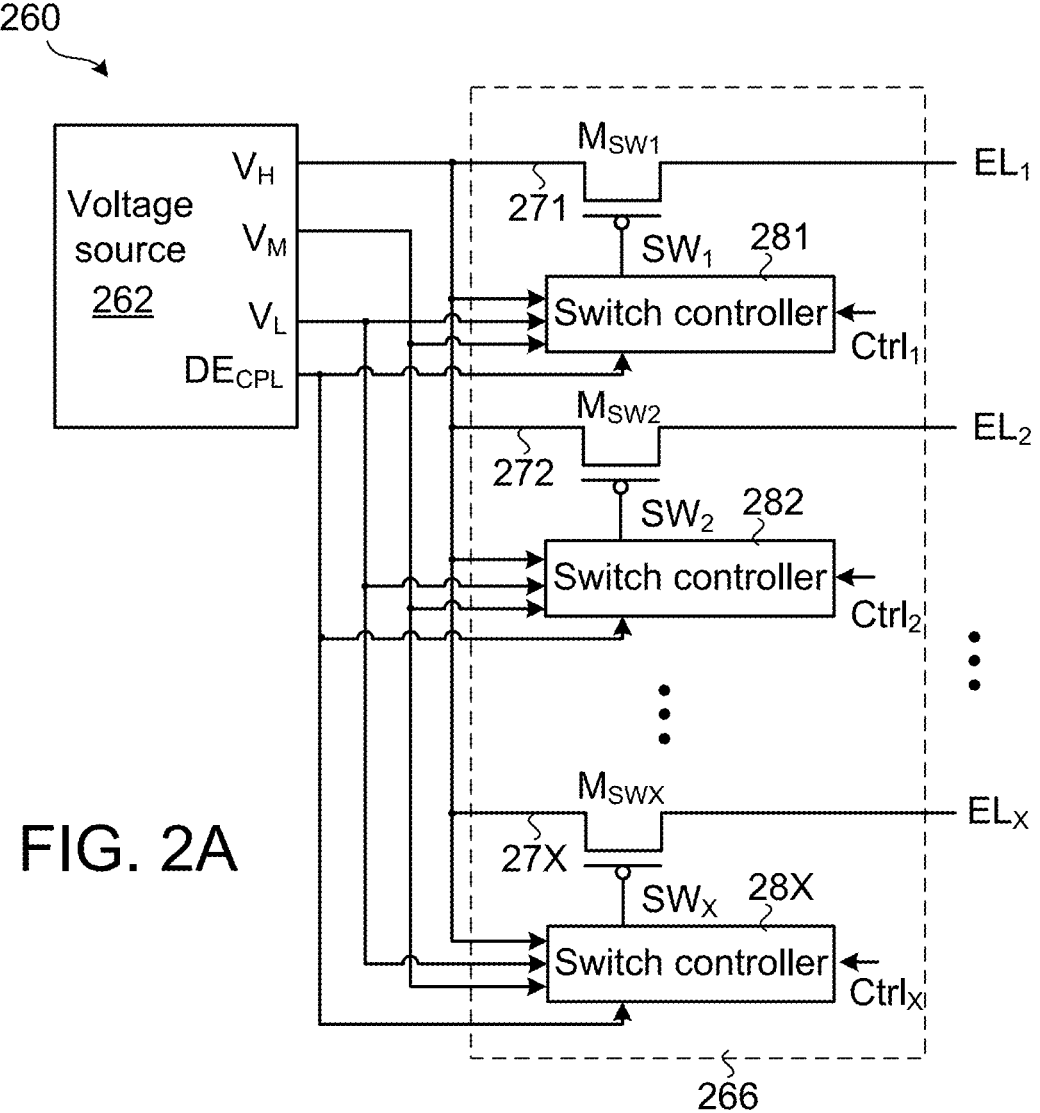
FIG. 2A is a schematic circuit diagram illustrating a power supplying circuit according to an embodiment of the present invention.
FIG. 2B is a table about the relationship between different supply voltages and different phases for the power supplying circuit shown in FIG. 2A.

FIG. 2A is a schematic circuit diagram illustrating a power supplying circuit 260 according to an embodiment of the present invention. FIG. 2B is a table about the relationship between different supply voltages and different phases for the power supplying circuit 260 shown in FIG. 2A. The power supplying circuit 260 can be applied to the non-volatile memory 100 of FIG. 1B, as an alternative of the power supplying circuit 160. For illustration, in the following embodiment, the supply voltage provided by the power supplying circuit 260 is the erase voltage $V_{EE}$.

The power supplying circuit 260 comprises a voltage source 262 and a switching circuit 266. The switching circuit 266 is connected with the voltage source 262 to receive a high voltage $V_H$, a medium voltage $V_M$ and a low voltage $V_L$ from the voltage source 262. In addition, the voltage source 262 further generates a decoupling signal $DE_{CPL}$ to the switching circuit 266.

When the power supplying circuit 260 is in different phases of a sector erase, the high voltage $V_H$, the medium voltage $V_M$, the low voltage $V_L$ from the voltage source 262 will be subjected to changes. For example, in successive different phases of the sector erase, the high voltage $V_H$, the medium voltage $V_M$, the low voltage $V_L$ will rise or remain unchanged only, but these voltages will not fall. Moreover, when the power supplying circuit 260 is in different phases of the sector erase, the voltage level of the decoupling signal $DE_{CPL}$ will also change and will not fall. The high voltage $V_H$ is higher than the low voltage $V_L$. The medium voltage $V_M$ is lower than or equal to the high voltage $V_H$. The medium voltage $V_M$ is higher than or equal to the low voltage $V_L$. That is, the medium voltage $V_M$ is in the range of the high voltage $V_H$ and the low voltage $V_L$. The voltage level of the decoupling signal $DE_{CPL}$ is lower than or equal to the high voltage $V_H$. The voltage level of the decoupling signal $DE_{CPL}$ is higher than or equal to the low voltage $V_L$.

That is, the voltage level of the decoupling signal $DE_{CPL}$ is in the range of the high voltage $V_H$ and the low voltage $V_L$.

The switching circuit 266 comprises X power paths 271~27X and X switch controllers 281~28X. The X power supply paths 271~27X and the X switch controllers 281~28X have a one-to-one correspondence. That is, one power path is connected with a switch controller. Furthermore, X switch controllers 281~28X respectively receive corresponding control signals $Ctrl_1$~$Ctrl_X$ and respectively generate switching signals $SW_1$~$SW_X$ to respectively control the corresponding power paths 271~27X.

Please refer to FIG. 2A again. The X power paths 271~27X comprise respective power switches. In an embodiment, these power switches are P-type switching transistors $M_{SW1}$~$M_{SWX}$. The first terminals of the X switching transistors $M_{SW1}$~$M_{SWX}$ are connected with the output terminal of the voltage source 262 to receive the high voltage $V_H$. The second terminals of the X switching transistors $M_{SW1}$~$M_{SWX}$ are coupled to the corresponding erase lines $EL_1$~$EL_X$, respectively. The control terminals of the switching transistors $M_{SW1}$~$M_{SWX}$ receive the corresponding switching signals $SW_1$~$SW_X$, respectively. In other words, the plural power paths 271~27X are constituted by the X switching transistors $M_{SW1}$~$M_{SWX}$, respectively. In some other embodiments, the power switches are N-type switching transistors.

The structures of the switch controllers 281~28X are identical. The switch controllers 281 to 28X are connected with the voltage source 262 to receive the high voltage $V_H$, the medium voltage $V_M$, the low voltage $V_L$ and the decoupling signal $DE_{CPL}$. The switch controllers 281~28X receive the corresponding control signals $Ctrl_1$~$Ctrl_X$, respectively. The control signals $Ctrl_1$~$Ctrl_X$ are respectively converted into the corresponding switching signals $SW_1$~$SW_X$ by the switch controllers 281~28X. The on/off states of the X switching transistors $M_{SW1}$~$M_{SWX}$ are respectively controlled according to the switching signals $SW_1$~$SW_X$. That is, the X power paths 271~27X are selectively turned on or turned off according to the switching signals $SW_1$~$SW_X$. In case that one of the power switch paths is turned on, the erase voltage $V_{EE}$ generated based on the high voltage $V_H$ can be transmitted to the corresponding erase line through the on-state power switch. For example, the maximum voltage stress that the switching transistors $M_{SW1}$~$M_{SWX}$ can withstand is about 8.5V. The voltage levels of the switching signals $SW_1$~$SW_X$ allow the X switching transistors $M_{SW1}$~$M_{SWX}$ to be operated normally within the SOA.

In successive different phases of the power supplying circuit 260, the high voltage $V_H$, the medium voltage $V_M$ and the low voltage $V_L$ will rise or remain unchanged only, but these voltages will not fall. Similarly, the voltage levels of the switching signals $SW_1$~$SW_X$ from the switch controllers 281~28X change with different phases. When the non-volatile memory 100 performs the sector erase, the power supplying circuit 260 will sequentially enter a logic phase $PH_{LOGIC}$, a transition phase $PH_{TRN}$ and an erase phase $PH_{ERS}$. In the erase phase $PH_{ERS}$, the erase voltage $V_{EE}$ generated based on the high voltage $V_H$ is transmitted to the corresponding erase line, and all memory cells in the corresponding sector are erased into the erase state. The time period of the logic phase $PH_{LOGIC}$ is about 2 µs. The time period of the transition phase $PH_{TRN}$ is about 6 µs. That is, when the sector erase is performed, the power supplying circuit 260 passes through the logic phase $PH_{LOGIC}$ and the transition phase $PH_{TRN}$ at first. That is, after about 8 µs, the power supplying circuit 260 enters the erase phase $PH_{ERS}$. In the erase phase $PH_{ERS}$, the power supplying circuit 260 can output the erase voltage $V_{EE}$ generated based on the high voltage $V_H$ to the corresponding erase line.

Please refer to FIG. 2B. In the logic phase $PH_{LOGIC}$, the high voltage $V_H$ outputted from the voltage source 262 is equal to the logic supply voltage $V_{DD}$, the medium voltage $V_M$ is equal to the logic supply voltage $V_{DD}$, and the low voltage $V_L$ is equal to the ground voltage (0 V), the logic supply voltage $V_{DD}$ is the same with the logic high level, and the ground voltage (0 V) is the same with the logic low level.

Please refer to FIG. 2B again. After the logic phase $PH_{LOGIC}$, the power supplying circuit 260 enters the transition phase $PH_{TRN}$. In the transition phase $PH_{TRN}$, the high voltage $V_H$ from the voltage source 262 rises to 8V, the medium voltage $V_M$ rises to 4 V, and the low voltage $V_L$ is maintained at the ground voltage (0 V). For example, the high voltage $V_H$ rises to a half of the erase voltage (i.e., $V_{EE}/2$), and the medium voltage $V_M$ rises to one-quarter of the erase voltage (i.e., $V_{EE}/4$).

Please refer to FIG. 2B again. After the transition phase $PH_{TRN}$, the power supplying circuit 260 enters the erase phase $PH_{ERS}$. In the erase phase $PH_{ERS}$, the high voltage $V_H$ from the voltage source 262 rises to 16 V, the medium voltage $V_M$ rises to 8 V, and the low voltage $V_L$ rises to 8 V. For example, the high voltage $V_H$ rises to the erase voltage $V_{EE}$, the medium voltage $V_M$ rises to a half of the erase voltage i.e., ($V_{EE}/2$), and the low voltage $V_L$ rises to a half of the erase voltage (i.e., $V_{EE}/2$).

Please refer to FIG. 2B again. It is noted that the high voltage $V_H$, the medium voltage $V_M$ and the low voltage $V_L$ in the table of FIG. 2B are presented herein for illustration. The magnitudes of the high voltage $V_H$, the medium voltage $V_M$, the low voltage $V_L$ and the decoupling signal $DE_{CPL}$ are not restricted as long as (1) the high voltage $V_H$ is higher than the low voltage $V_L$ in any phase and (2) the medium voltage $V_M$ is in the range of the high voltage $V_H$ and the low voltage $V_L$ in any phase. In addition, the decoupling signal $DE_{CPL}$ is in the range of the high voltage $V_H$ and the low voltage $V_L$ in any phase. The switch controllers 281~28X generate the switching signals $SW_1$~$SW_X$ according to the high voltage $V_H$, the medium voltage $V_M$, the low voltage $V_L$ and the decoupling signal $DE_{CPL}$. Given that the high voltage $V_H$ and the switching signals $SW_1$~$SW_X$ are supplied to the switching transistors $M_{SW1}$~$M_{SWX}$, the magnitudes of the high voltage $V_H$, the medium voltage $V_M$, the low voltage $V_L$ and the decoupling signal $DE_{CPL}$ may be modified according to the magnitude of the erase voltage $V_{EE}$ and the maximum voltage stress that the switching transistors $M_{SW1}$~$M_{SWX}$ can withstand. That is to say, the high voltage $V_H$, the medium voltage $V_M$, the low voltage $V_L$ and the decoupling signal $DE_{CPL}$ are increased in a multi-step manner during the sector erase of the non-volatile memory 100. Moreover, the decoupling signal $DE_{CPL}$ is in a range of the high voltage $V_H$ and the low voltage $V_L$ during the sector erase.

Figure 3:
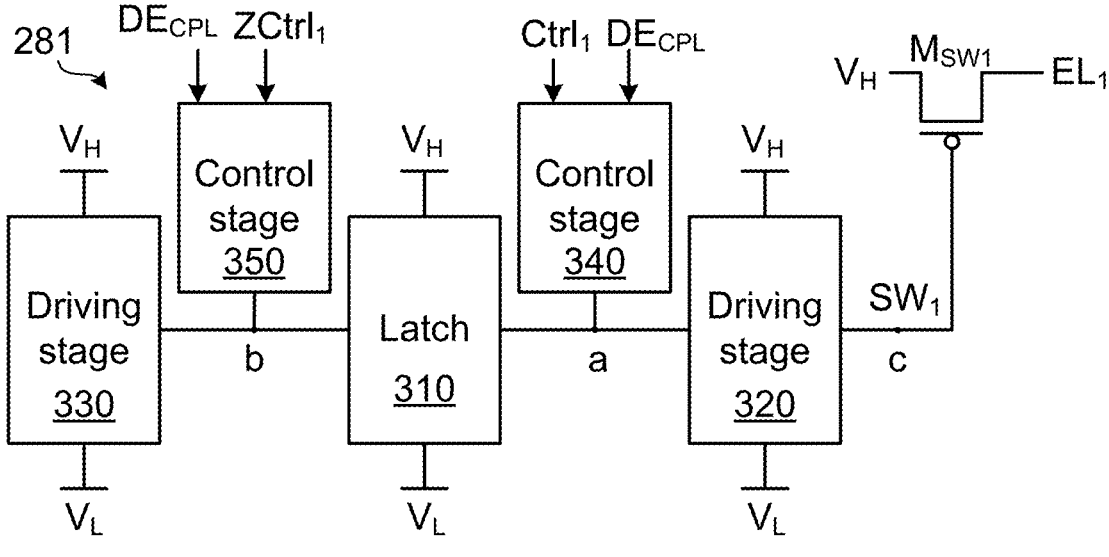
FIG. 3 is a schematic circuit diagram illustrating a switch controller according to a first embodiment of the present invention.

FIG. 3 is a schematic circuit diagram illustrating a switch controller 281 according to a first embodiment of the present invention. The structures of the switch controllers 281~28X are identical. For succinctness, only the circuitry structure of the switch controller 281 will be described as follows. The circuitry structures of the other switch controllers 282~28X will not be redundantly described herein. The switch controller 281 generates the switching signal $SW_1$. The control terminal of the switching transistor $M_{SW1}$ receives the switching signal $SW_1$. The first terminal of the switching transistor $M_{SW1}$ receives the high voltage $V_H$. The second terminal of the switching transistor $M_{SW1}$ is coupled to the erase line $EL_1$.

In this embodiment, the switch controller 281 comprises a latch 310, two driving stages 320 and 330 and two control stages 340 and 350.

The two power terminals of the latch 310 receive the high voltage $V_H$ and the low voltage $V_L$, respectively. The first control terminal of the latch 310 is couple to the node a. The second control terminal of the latch 310 is coupled to the node b.

The control stage 340 is connected with the node a. The control stage 340 receives the control signal $Ctrl_1$ and the decoupling signal $DE_{CPL}$. The control stage 350 is connected with the node b. The control stage 350 receives an inverted control signal $ZCtrl_1$ and the decoupling signal $DE_{CPL}$. That is to say, the control stage 340 is coupled to the node a, and the control stage 340 is configured to control the voltage at the node a according to the control signal $Ctrl_1$ and the decoupling signal $DE_{CPL}$. The control stage 350 is coupled to the node b, and the control stage 350 is configured to control the voltage at the node b according to the inverted control signal $ZCtrl_1$ and the decoupling signal $DE_{CPL}$.

The two power terminals of the driving stage 320 receive the high voltage $V_H$ and the low voltage $V_L$, respectively. The input terminal of the driving stage 320 is connected with the node a. The output terminal of the driving stage 320 is connected with the control terminal of the switching transistor $M_{SW1}$ through the node c. The output terminal of the driving stage 320 generates the switching signal $SW_1$. The two power terminals of the driving stage 330 receive the high voltage $V_H$ and the low voltage $V_L$, respectively. The input terminal of the driving stage 330 is connected with the node b. The inverted control signal $ZCtrl_1$ is outputted from the processing unit 150 of the non-volatile memory 100. Alternatively, the switch controller 281 is equipped with an inverter (not shown). The inverter receives the control signal $Ctrl_1$ and outputs the inverted control signal $ZCtrl_1$. That is to say, the driving stage 320 is coupled to the node c and the control terminal of the switching transistor $M_{SW1}$, and the driving stage 320 is configured to output the high voltage $V_H$ or the low voltage $V_L$ as the switching signal $SW_1$ to the control terminal of the switching transistor $M_{SW1}$ according to a voltage at the node a.

In the logic phase $PH_{LOGIC}$, the control signal $Ctrl_1$ is latched by the latch 310. That is, in the logic phase $PH_{LOGIC}$, the control signal $Ctrl_1$ is stored in the latch 310. In the transition phase $PH_{TRN}$, the decoupling signal $DE_{CPL}$ is activated. The control stage 340 is decoupled from the node a, and the control stage 350 is decoupled from the node b. In the erase phase $PH_{ERS}$, the latch 310 and the driving stages 320 and 330 generate the switching signal $SW_1$ according to the high voltage $V_H$ and the low voltage $V_L$. According to the switching signal $SW_1$, the switching transistor $M_{SW1}$ is correspondingly controlled.

Figure 4:
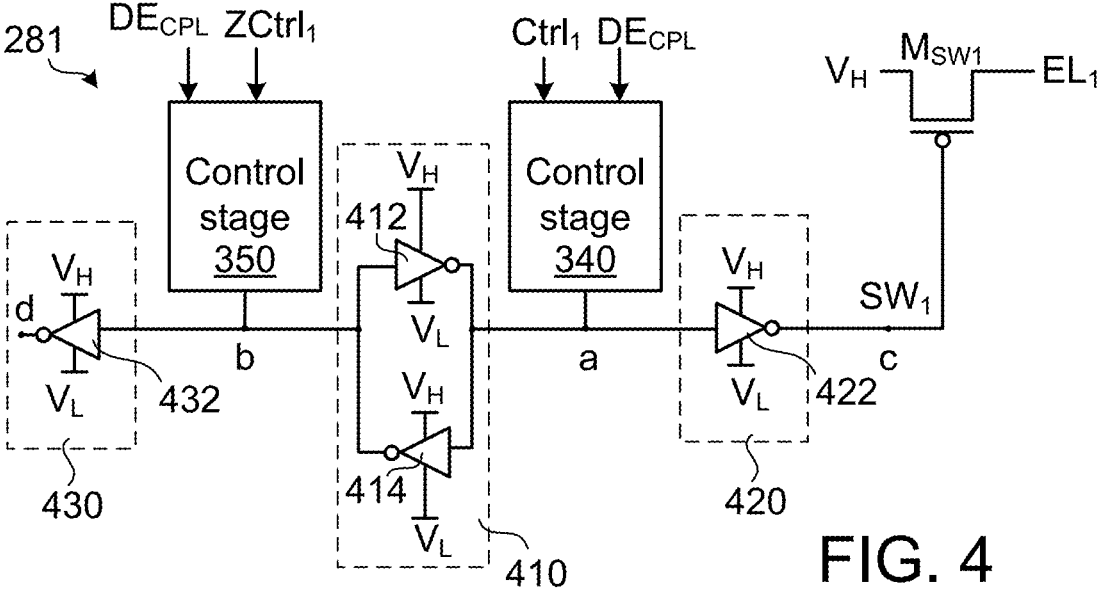
FIG. 4 is a schematic circuit diagram illustrating a switch controller according to a second embodiment of the present invention.

FIG. 4 is a schematic circuit diagram illustrating a switch controller 281 according to a second embodiment of the present invention. In this embodiment, the switch controller 281 comprises a latch 410, two driving stages 420 and 430 and two control stages 340 and 350. The structures of the control stages 340 and 350 are similar to those shown in FIG. 3, and are not redundantly described herein.

The latch 410 comprises two inverters 412 and 414. The two power terminals of the inverter 412 receive the high voltage $V_H$ and the low voltage $V_L$, respectively. The two power terminals of the inverter 414 receive the high voltage $V_H$ and the low voltage $V_L$, respectively. The input terminal of the inverter 412 is connected with the node b. The output terminal of the inverter 412 is connected with the node a.

The input terminal of the inverter 414 is connected with the node a. The output terminal of the inverter 414 is connected with the node b.

The driving stage 420 comprises an inverter 422. The two power terminals of the inverter 422 receive the high voltage $V_H$ and the low voltage $V_L$, respectively. The input terminal of the inverter 422 is connected with the node a. The output terminal of the inverter 422 is connected with the control terminal of the switching transistor $M_{SW1}$ through the node c. The output terminal of the inverter 422 generates the switching signal $SW_1$. Similarly, the driving stage 430 comprises an inverter 432. The two power terminals of the inverter 432 receive the high voltage $V_H$ and the low voltage $V_L$, respectively. The input terminal of the inverter 432 is connected with the node b. The output terminal of the inverter 432 is connected with the node d.

The operations of the switch controller 281 of this embodiment are similar to those of the switch controller 281 of the first embodiment and are not redundantly described herein. It is noted that the structure of the switch controller 281 may be modified according to the teachings of the present invention. For example, in another embodiment, the latch 410 comprises other types of electronic components. An example of the latch 410 is a D-latch or an SR-latch. Alternatively, the driving stage 420 comprises more inverters connected between the node a and the node c in series.

Figures 5, 6A:
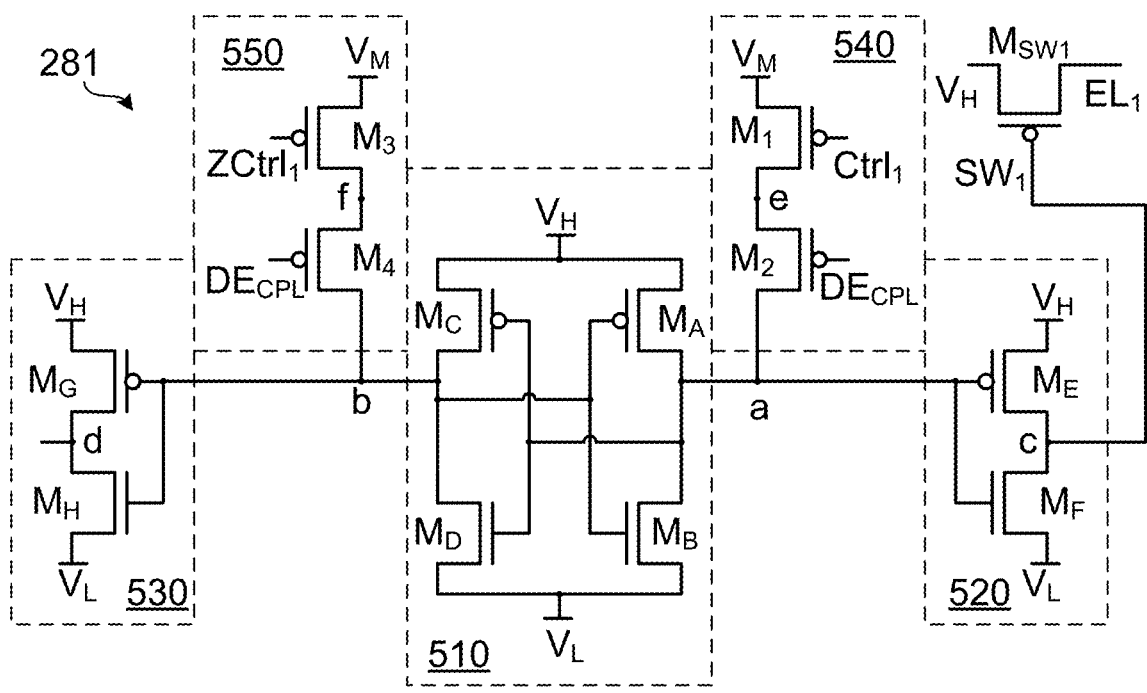
FIG. 5 is a schematic circuit diagram illustrating a switch controller according to a third embodiment of the present invention.
FIGS. 6A, 6B and 6C schematically illustrate the voltages at various nodes of the switch controller of the third embodiment in different phases.

FIG. 5 is a schematic circuit diagram illustrating a switch controller 281 according to a third embodiment of the present invention. In this embodiment, the switch controller 281 comprises fewer transistors. Consequently, the layout area of the power supplying circuit 260 can be saved.

As shown in FIG. 5, the first control terminal of latch 510 is connected with the node a, and the second control terminal of latch 510 is connected with the node b. The transistor $M_A$ and the transistor $M_B$ are collaboratively formed as a first inverter. The input terminal of the first inverter is connected with the node b. The input terminal of the first inverter is connected with the gate terminal of the transistor $M_A$ and the gate terminal of the transistor $M_B$. The output terminal of the first inverter is connected with the node a. The output terminal of the first inverter is connected with the drain terminal of the transistor $M_A$ and the drain terminal of the transistor $M_B$. The source terminal of the transistor $M_A$ receives the high voltage $V_H$. The source terminal of the transistor $M_B$ receives the low voltage $V_L$. The transistor $M_C$ and the transistor $M_D$ are collaboratively formed as a second inverter. The input terminal of the second inverter is connected with the node a. In addition, the input terminal of the second inverter is connected with the gate terminal of the transistor $M_C$ and the gate terminal of the transistor $M_D$. The output terminal of the second inverter is connected with the node b. The output terminal of the second inverter is connected with the drain terminal of the transistor $M_C$ and the drain terminal of the transistor $M_D$. The source terminal of the transistor $M_C$ receives the high voltage $V_H$. The source terminal of the transistor $M_D$ receives the low voltage $V_L$.

The driving stage 520 comprises an inverter. The transistor $M_E$ and the transistor $M_F$ are collaboratively formed as the inverter. The input terminal of the inverter is connected with the node a. In addition, the input terminal of the inverter is connected with the gate terminal of the transistor $M_E$ and the gate terminal of the transistor $M_F$. The source terminal of the transistor $M_E$ receives the high voltage $V_H$. The source terminal of the transistor $M_F$ receives the low voltage $V_L$. The output terminal of the inverter is connected with the node c. The output terminal of the inverter is connected with the drain terminal of the transistor $M_E$ and the drain terminal of the transistor $M_F$. Furthermore, the voltage at the node c is the switching signal $SW_1$. The node c is connected with the gate terminal of the switching transistor $M_{SW1}$. Consequently, the switching transistor $M_{SW1}$ receives the switching signal $SW_1$.

Similarly, the driving stage 530 comprises an inverter. The transistor $M_G$ and the transistor $M_H$ are collaboratively formed as the inverter. The input terminal of the inverter is connected with the node b. The input terminal of the inverter is connected with the gate terminal of the transistor $M_G$ and the gate terminal of the transistor $M_H$. The source terminal of the transistor $M_G$ receives the high voltage $V_H$. The source terminal of the transistor $M_H$ receives the low voltage $V_L$. The output terminal of the inverter is connected with the node d. The output terminal of the inverter is connected with the drain terminal of the transistor $M_G$ and the drain terminal of the transistor $M_H$. In fact, the driving stage 530 can be omitted to save the layout area of the power supplying circuit 260.

The control stage 540 comprises two transistors $M_1$ and $M_2$. The gate terminal of the transistor $M_1$ receives the control signal $Ctrl_1$. The source terminal of the transistor $M_1$ receives the medium voltage $V_M$. The drain terminal of the transistor $M_1$ is connected with the node e. The gate terminal of transistor $M_2$ receives the decoupling signal $DE_{CPL}$. The source terminal of the transistor $M_2$ is connected with the node e. The drain terminal of the transistor $M_2$ is connected with the node a.

The control stage 550 comprises two transistors $M_3$ and $M_4$. The gate terminal of the transistor $M_3$ receives the inverted control signal $ZCtrl_1$. The source terminal of the transistor $M_3$ receives the medium voltage $V_M$. The drain terminal of the transistor $M_3$ is connected with the node f. The gate terminal of transistor $M_4$ receives the decoupling signal $DE_{CPL}$. The source terminal of the transistor $M_4$ is connected with the node f. The drain terminal of the transistor $M_4$ is connected with the node b.

The control stages 540 and 550 are used to control the voltages at all nodes a~f in the switch controller 281. Consequently, during the operations of the switch controller 281, all transistors $M_1$~$M_4$ and $M_A$~$M_H$ can be operated normally within the SOA.

Figure 6B:
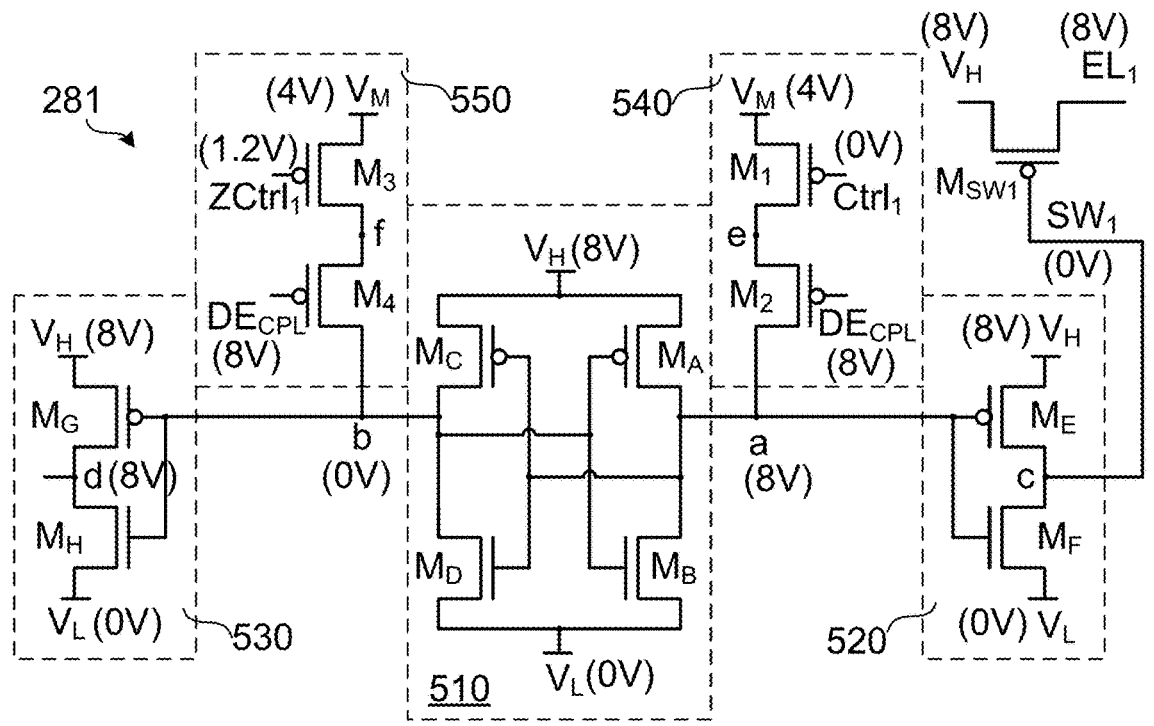
Figure 6C:
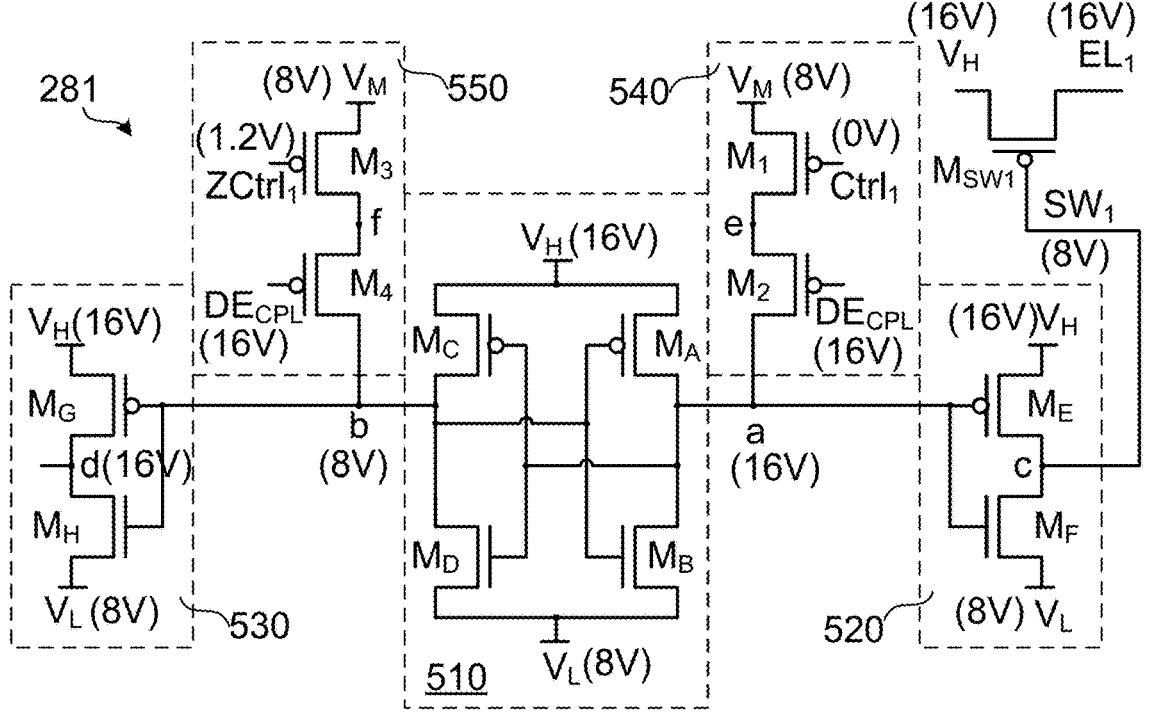

FIGS. 6A, 6B and 6C schematically illustrate the voltages at various nodes of the switch controller 281 of the third embodiment in different phases.

Please refer to FIG. 6A. In the logic phase $PH_{LOGIC}$, the logic supply voltage $V_{DD}$ is 1.2 V. That is, the high voltage $V_H$ is 1.2 V, the medium voltage $V_M$ is 1.2 V, and the low voltage $V_L$ is 0 V. For example, the control signal $Ctrl_1$ is activated and is in a logic low level state (0 V), the inverted control signal $ZCtrl_1$ is in a logic high level state (1.2 V), and the decoupling signal $DE_{CPL}$ is 0 V. The decoupling signal $DE_{CPL}$ of about 0 V can be regarded as the decoupling signal $DE_{CPL}$ not activated, that is, the decoupling signal $DE_{CPL}$ is not activated in the logic phase $PH_{LOGIC}$. Meanwhile, in the control stage 540, the transistor $M_1$ is turned on, the transistor $M_2$ is turned on, and the voltages at the nodes e and a are pulled up to 1.2 V. In the control stage 550, the transistor $M_3$ is turned off. Consequently, the voltage at the node b is pulled down to 0 V by the latch 510, and the latch 510 stores the control signal $Ctrl_1$ at the node b.

As mentioned above, the voltage at the node b is 0 V. Consequently, in the driving stage 530, the transistor $M_G$ is turned on, the transistor $M_H$ is turned off, and the voltage at the node d is 1.2 V. The voltage at the node a is 1.2V. Consequently, in the driving stage 520, the transistor $M_F$ is turned on, the transistor $M_E$ is turned off, and the voltage at the node c is 0 V. That is, the switching signal $SW_1$ outputted from the driving stage 520 is 0 V. Since the switching signal $SW_1$ is 0 V, the switching transistor $M_{SW1}$ is turned on, and the high voltage $V_H$ (1.2 V) is transmitted to the erase line $EL_1$. That is, in the logic phase $PH_{LOGIC}$, the voltage of the erase line $EL_1$ is 1.2 V and has not risen to the erase voltage $V_{EE}$. Consequently, the sector erase cannot be performed.

Please refer to FIG. 6B. In the transition phase $PH_{TRN}$, the high voltage $V_H$ is 8 V, the medium voltage $V_M$ is 4 V, and the low voltage $V_L$ is 0 V. The control signal $Ctrl$ is in the logic low level state (0 V). The inverted control signal $ZCtrl_1$ is in the logic high level state (1.2 V). The decoupling signal $DE_{CPL}$ is 8 V, that is, the decoupling signal $DE_{CPL}$ is activated in the transition phase $PH_{TRN}$. Since the decoupling signal $DE_{CPL}$ is 8V, the decoupling signal $DE_{CPL}$ is activated in the control stage 540. Consequently, the transistor $M_2$ is turned off, and the control stage 540 is decoupled from the node a. Similarly, the decoupling signal $DE_{CPL}$ is activated in the control stage 550. Consequently, the transistor $M_4$ is turned off, and the control stage 550 is decoupled from the node b.

As mentioned above, the high voltage $V_H$ rises to 8 V. The voltage at the node a is pulled up to 8 V by the latch 510. The voltage at the node b is maintained at 0 V. Consequently, in the driving stage 530, the transistor $M_G$ is turned on, the transistor $M_H$ is turned off, and the voltage at the node d is 8 V. As mentioned above, the voltage at the node a is 8 V. Consequently, in the driving stage 520, the transistor $M_F$ is turned on, the transistor $M_E$ is turned off, and the voltage at the node c is 0 V. That is, the switching signal $SW_1$ outputted from the driving stage 520 is 0 V. Since the switching signal $SW_1$ is 0 V, the switching transistor $M_{SW1}$ is turned on, and the high voltage $V_H$ (8 V) is transmitted to the erase line $EL_1$. That is, in the transition phase $PH_{TRN}$, the voltage of the erase line $EL_1$ is 8V and has not risen to the erase voltage $V_{EE}$. Consequently, the sector erase cannot be performed.

Please refer to FIG. 6C. In the erase phase $PH_{ERS}$, the high voltage $V_H$ is 16 V (i.e., $V_{EE}$), the medium voltage $V_M$ is 8 V, and the low voltage $V_L$ is 8 V. The control signal $Ctrl_1$ is in the logic low level state (0 V). The inverted control signal $ZCtrl_1$ is in the logic high level state (1.2 V). The decoupling signal $DE_{CPL}$ is 16 V, that is, the decoupling signal $DE_{CPL}$ is activated in the erase phase $PH_{ERS}$. Since the decoupling signal $DE_{CPL}$ is 16 V, the decoupling signal $DE_{CPL}$ is activated in the control stage 540. Consequently, the transistor $M_2$ is turned off, and the control stage 540 is decoupled from the node a. Similarly, the decoupling signal $DE_{CPL}$ is activated in the control stage 550. Consequently, the transistor $M_4$ is turned off, and the control stage 550 is decoupled from the node b.

As mentioned above, the high voltage $V_H$ rises to 16 V, and the low voltage $V_L$ rises to 8 V. The voltage at the node a is further pulled up to 16 V by the latch 510. The voltage at the node b is pulled up to 8 V by the latch 510. Consequently, in the driving stage 530, the transistor $M_G$ is turned on, the transistor $M_H$ is turned off, and the voltage at the node d is 16 V. As mentioned above, the voltage at the node a is 16 V. Consequently, in the driving stage 520, the transistor $M_F$ is turned on and the transistor $M_E$ is turned off, and the voltage at the node c is 8 V. That is, the switching signal $SW_1$ outputted from the driving stage 520 is 8 V. Since the switching signal $SW_1$ is 8 V, the switching transistor $M_{SW1}$ is turned on, and the high voltage $V_H$ (16 V) is transmitted to the erase line $EL_1$. Meanwhile, the voltage of the erase line $EL_1$ is 16 V and equal to the erase voltage $V_{EE}$. That is, when the power supplying circuit 260 enters the erase phase $PH_{ERS}$, the erase voltage $V_{EE}$ can be transmitted to the first sector $SE_1$ through the erase line $EL_1$. Consequently, the memory cells in the first sector $SE_1$ are erased into the erased state.

In case that the control signal $Ctrl_1$ is not activated, the control signal $Ctrl_1$ is in the logic high level state (1.2 V), the inverted control signal $ZCtrl_1$ is in the logic low level state (0 V). The switching signal $SW_1$ generated in each of the logic phase $PH_{LOGIC}$, the transition phase $PH_{TRN}$ and the erase phase $PH_{ERS}$ can be referred to voltage of the node d in FIGS. 6A~6C. That is, in the logic phase $PH_{LOGIC}$, the switching signal $SW_1$ is equal to the high voltage $V_H$ (1.2 V), the switching transistor $M_{SW1}$ is turned off, and the high voltage $V_H$ (1.2 V) is not transmitted to the erase line $EL_1$. In the transition phase $PH_{TRN}$, the switching signal $SW_1$ is equal to the high voltage $V_H$ (8 V), the switching transistor $M_{SW1}$ is turned off, and the high voltage $V_H$ (8 V) is not transmitted to the erase line $EL_1$. In the erase phase $PH_{ERS}$, the switching signal $SW_1$ is equal to the high voltage $V_H$ (16 V), the switching transistor $M_{SW1}$ is turned off, and the high voltage $V_H$ (16 V) is not transmitted to the erase line $EL_1$. Since the high voltage $V_H$ (16 V, i.e., the erase voltage $V_{EE}$) is not transmitted to the erase line $EL_1$, the memory cells in the first sector $SE_1$ will not be erased into the erased state.

According to the operations of FIGS. 6A, 6B and 6C, the maximum voltage stress that all switching transistors in the switch controller 281 can withstand is, for example, about 8.5 V. The voltage stress withstood by each transistor in the switch controller 281 is lower than 8.5 V, owing to the high voltage $V_H$, the medium voltage $V_M$, the low voltage $V_L$ and the decoupling signal $DE_{CPL}$ that are increased in a multi-step manner during the different phases. Therefore, the switch controller 281 may not require additional transistors to share the voltage difference between the high voltage $V_H$ and the low voltage $V_L$ or the voltage difference between the medium voltage $V_M$ and the voltage at the node a (or at the node b). Consequently, the switch controller 281 has low area penalty. Similarly, the voltage stress withstood by the switching transistor $M_{SW1}$ is lower than the maximum voltage stress (e.g., 8.5 V). In other words, when the sector erase is performed, the switch controllers 281~28X and the switching transistors $M_{SW1}~M_{SWX}$ in the power supplying circuit 260 can be operated normally within the SOA.

Figures 7, 8A:
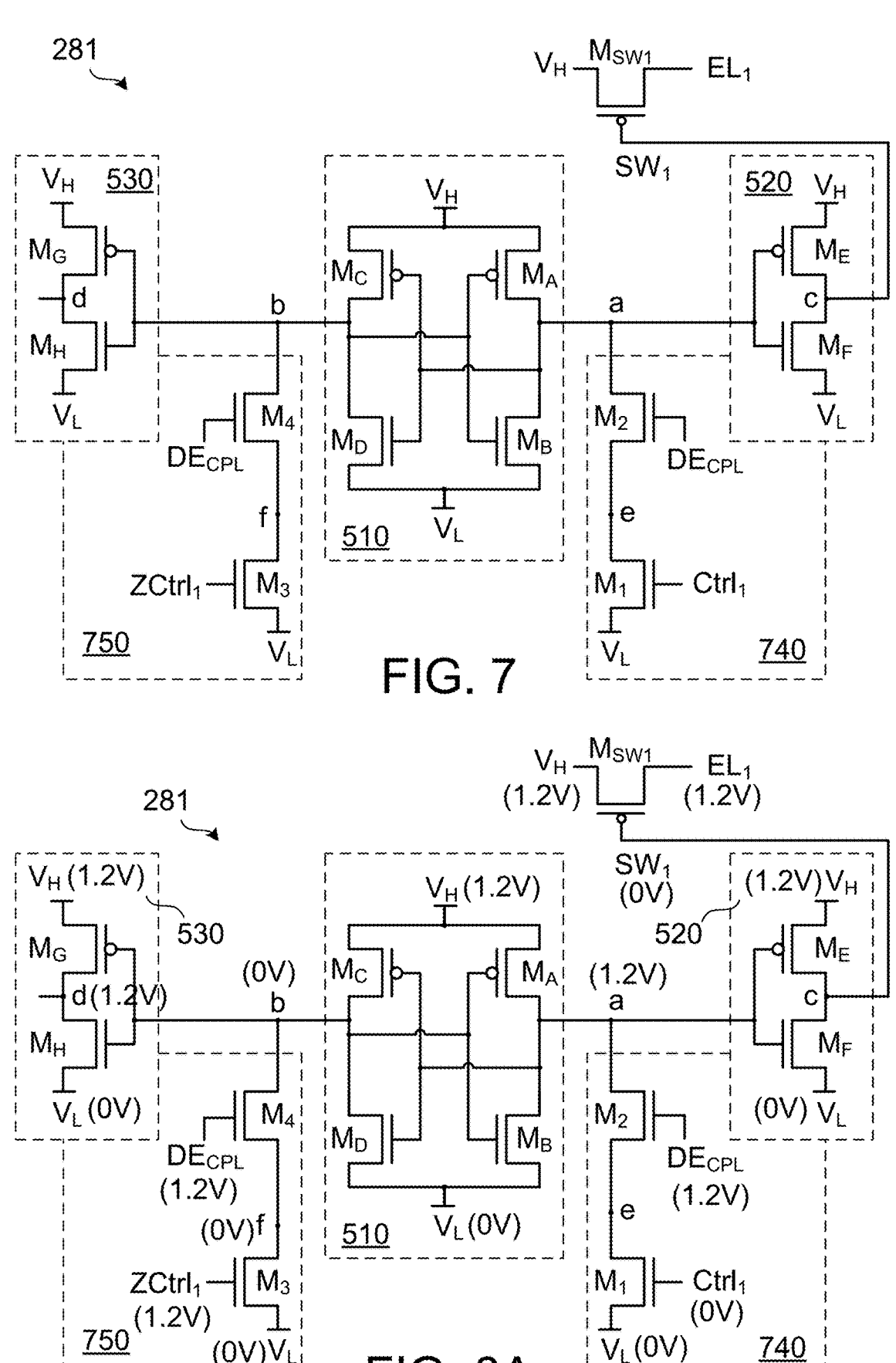
FIG. 7 is a schematic circuit diagram illustrating a switch controller according to a fourth embodiment of the present invention.
FIGS. 8A, 8B and 8C schematically illustrate the voltages at various nodes of the switch controller of the fourth embodiment in different phases.

FIG. 7 is a schematic circuit diagram illustrating a switch controller 281 according to a fourth embodiment of the present invention. In comparison with the third embodiment, the structures of the control stages 740 and 750 in the fourth embodiment are distinguished. The structures of the latch 510 and the driving stages 520 and 530 are similar and are not redundantly described herein. For brevity, only the structures of the control stages 740 and 750 will be described as follows.

The control stage 740 comprises two transistors $M_1$ and $M_2$. The gate terminal of the transistor $M_1$ receives the control signal $Ctrl_1$. The source terminal of the transistor $M_1$ receives the low voltage $V_L$. The drain terminal of the transistor $M_1$ is connected with the node e. The gate terminal of transistor $M_2$ receives the decoupling signal $DE_{CPL}$. The source terminal of the transistor $M_2$ is connected with the node e. The drain terminal of the transistor $M_2$ is connected with the node a.

The control stage 750 comprises two transistors $M_3$ and $M_4$. The gate terminal of the transistor $M_3$ receives the inverted control signal $ZCtrl_1$. The source terminal of the transistor $M_3$ receives the low voltage $V_L$. The drain terminal of the transistor $M_3$ is connected with the node f. The gate terminal of transistor $M_4$ receives the decoupling signal $DE_{CPL}$. The source terminal of the transistor $M_4$ is connected with the node f. The drain terminal of the transistor $M_4$ is connected with the node b.

In this embodiment, the voltage source 262 needs not to output the medium voltage $V_M$ to the switch controllers 281~28x. In some embodiment, the medium voltage $V_M$ may be served as the decoupling signal $DE_{CPL}$.

Figures 8B, 8C:
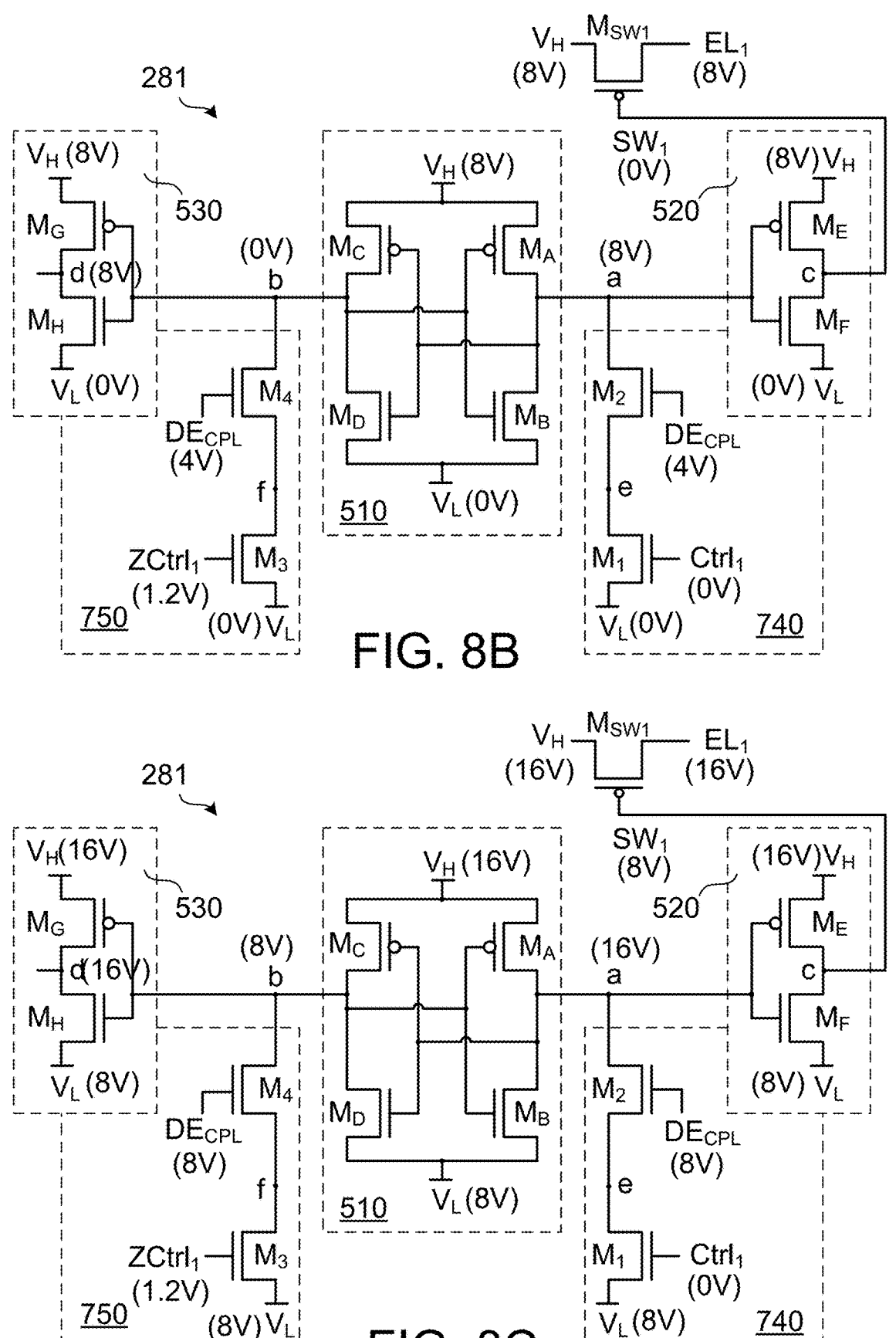

FIGS. 8A, 8B and 8C schematically illustrate the voltages at various nodes of the switch controller 281 of the fourth embodiment in different phases.

Please refer to FIG. 8A. In the logic phase $PH_{LOGIC}$, the logic supply voltage $V_{DD}$ is 1.2 V. That is, the high voltage $V_H$ is 1.2 V and the low voltage $V_L$ is 0 V. For example, the control signal $Ctrl_1$ is activated and is in a logic low level state (0 V), the inverted control signal $ZCtrl_1$ is in a logic high level state (1.2 V), and the decoupling signal $DE_{CPL}$ is 1.2 V. Meanwhile, in the control stage 750, the transistor $M_3$ is turned on, the transistor $M_4$ is turned on, and the voltages at the nodes f and b are pulled down to 0 V. Consequently, the latch 510 stores the control signal $Ctrl_1$, and the voltage at the node a is pulled up to 1.2 V by the latch 510. Moreover, in the control stage 740, the transistor $M_1$ is turned off.

As mentioned above, the voltage at the node b is 0 V. Consequently, in the driving stage 530, the transistor $M_G$ is turned on, the transistor $M_H$ is turned off, and the voltage at the node d is 1.2 V. The voltage at the node a is 1.2 V. Consequently, in the driving stage 520, the transistor $M_F$ is turned on, the transistor $M_E$ is turned off, and the voltage at the node c is 0 V. That is, the switching signal $SW_1$ outputted from the driving stage 520 is 0 V. Since the switching signal $SW_1$ is 0 V, the switching transistor $M_{SW1}$ is turned on, and the high voltage $V_H$ (1.2 V) is transmitted to the erase line $EL_1$. That is, in the logic phase $PH_{LOGIC}$, the voltage of the erase line $EL_1$ is 1.2 V and has not risen to the erase voltage $V_{EE}$. Consequently, the sector erase cannot be performed.

Please refer to FIG. 8B. In the transition phase $PH_{TRN}$, the high voltage $V_H$ is 8V and the low voltage $V_L$ is 0 V. The control signal $Ctrl_1$ is in the logic low level state (0 V). The inverted control signal $ZCtrl$ is in the logic high level state (1.2 V). The decoupling signal $DE_{CPL}$ is 4V. Since the decoupling signal $DE_{CPL}$ is 4V, the transistor $M_2$ and $M_4$ are in the conducting state. That means the transistor $M_2$ and $M_4$ are turned on. Furthermore, the transistor $M_3$ in the control stage 750 is turned on by the inverted control signal $ZCtrl_1$ (1.2 V), and the transistor $M_1$ in the control stage 740 is turned off by the control signal $Ctrl_1$ (0 V). Consequently, the voltage at the node b is maintained at 0 V.

As mentioned above, the high voltage $V_H$ rises to 8 V. The voltage at the node a is pulled up to 8 V by the latch 510. The voltage at the node b is maintained at 0 V. Consequently, in the driving stage 530, the transistor $M_G$ is turned on, the transistor $M_H$ is turned off, and the voltage at the node d is 8 V. As mentioned above, the voltage at the node a is 8 V. Consequently, in the driving stage 520, the transistor $M_F$ is turned on, the transistor $M_E$ is turned off, and the voltage at the node c is 0 V. That is, the switching signal $SW_1$ outputted from the driving stage 520 is 0 V. Since the switching signal $SW_1$ is 0 V, the switching transistor $M_{SW1}$ is turned on, and the high voltage $V_H$ (8 V) is transmitted to the erase line $EL_1$. That is, in the transition phase $PH_{TRN}$, the voltage of the erase line $EL_1$ is 8 V and has not risen to the erase voltage $V_{EE}$. Consequently, the sector erase cannot be performed.

Please refer to FIG. 8C. In the erase phase $PH_{ERS}$, the high voltage $V_H$ is 16 V (i.e., $V_{EE}$), and the low voltage $V_L$ is 8 V. The control signal $Ctrl_1$ is in the logic low level state (0 V). The inverted control signal $ZCtrl_1$ is in the logic high level state (1.2 V). The decoupling signal $DE_{CPL}$ is 8 V. Since the low voltage $V_L$ rises from 0 V to 8 V, the transistor $M_1$ and transistor $M_3$ are turned off. In addition, the voltage at the node e and the voltage at the node f rise, causing the transistor $M_4$ and the transistor $M_2$ to turn off. Consequently, the control stage 740 is decoupled from the node a. Similarly, control stage 750 is decoupled from the node b.

As mentioned above, the high voltage $V_H$ rises to 16 V, and the low voltage $V_L$ rises to 8 V. The voltage at the node a is further pulled up to 16 V by the latch 510. The voltage at the node b is pulled up to 8 V by the latch 510. Consequently, in the driving stage 530, the transistor $M_G$ is turned on, the transistor $M_H$ is turned off, and the voltage at the node d is 16 V. As mentioned above, the voltage at the node a is 16 V. Consequently, in the driving stage 520, the transistor $M_F$ is turned on, the transistor $M_E$ is turned off, and the voltage at the node c is 8 V. That is, the switching signal $SW_1$ outputted from the driving stage 520 is 8 V. Since the switching signal $SW_1$ is 8 V, the switching transistor $M_{SW1}$ is turned on, and the high voltage $V_H$ (16 V) is transmitted to the erase line $EL_1$. Meanwhile, the voltage of the erase line $EL_1$ is 16 V and equal to the erase voltage $V_{EE}$. That is, when the power supplying circuit 260 enters the erase phase $PH_{ERS}$, the erase voltage $V_{EE}$ can be transmitted to the first sector $SE_1$ through the erase line $EL_1$. Consequently, the memory cells in the first sector $SE_1$ are erased into the erased state.

In case that the control signal $Ctrl_1$ is not activated, the control signal $Ctrl_1$ is in the logic high level state (1.2 V), the inverted control signal $ZCtrl_1$ is in the logic low level state (0 V). The switching signal $SW_1$ generated in each of the logic phase $PH_{LOGIC}$, the transition phase $PH_{TRN}$ and the erase phase $PH_{ERS}$ can be referred to voltage of the node d in FIGS. 8A~8C. That is, in the logic phase $PH_{LOGIC}$, the switching signal $SW_1$ is equal to the high voltage $V_H$ (1.2 V), the switching transistor $M_{SW1}$ is turned off, and the high voltage $V_H$ (1.2 V) is not transmitted to the erase line $EL_1$. In the transition phase $PH_{TRN}$, the switching signal $SW_1$ is equal to the high voltage $V_H$ (8 V), the switching transistor $M_{SW1}$ is turned off, and the high voltage $V_H$ (8 V) is not transmitted to the erase line $EL_1$. In the erase phase $PH_{ERS}$, the switching signal $SW_1$ is equal to the high voltage $V_H$ (16 V), and the switching transistor $M_{SW1}$ is turned off. Since the high voltage $V_H$ (16 V, i.e., the erase voltage $V_{EE}$) is not transmitted to the erase line $EL_1$, the memory cells in the first sector $SE_1$ will not be erased into the erased state.

According to the operations of FIGS. 8A, 8B and 8C, the maximum voltage stress that all switching transistors in the switch controller 281 can withstand is, for example, about 8.5V. The voltage stress withstood by each transistor in the switch controller 281 is lower than 8.5 V, owing to the high voltage $V_H$, the decoupling signal $DE_{CPL}$ and the low voltage $V_L$ that are increased in the multi-step manner during the different phases. Consequently, as aforementioned, the switch controller 281 of FIG. 7 has low area penalty. Similarly, the voltage stress withstood by the switching transistor $M_{SW1}$ is lower than the maximum voltage stress (e.g., 8.5 V). In other words, when the sector erase is performed, the switch controllers 281~28X and the switching transistors $M_{SW1}$~$M_{SWX}$ in the power supplying circuit 260 can be operated normally within the SOA.

In the switch controller 281 of the fourth embodiment, the node e of the control stage 740 and the node f of the control stage 750 are possibly in the floating state in the erase phase $PH_{ERS}$. Consequently, the control stages 740 and 750 of the fourth embodiment can be further modified.

Figure 9:
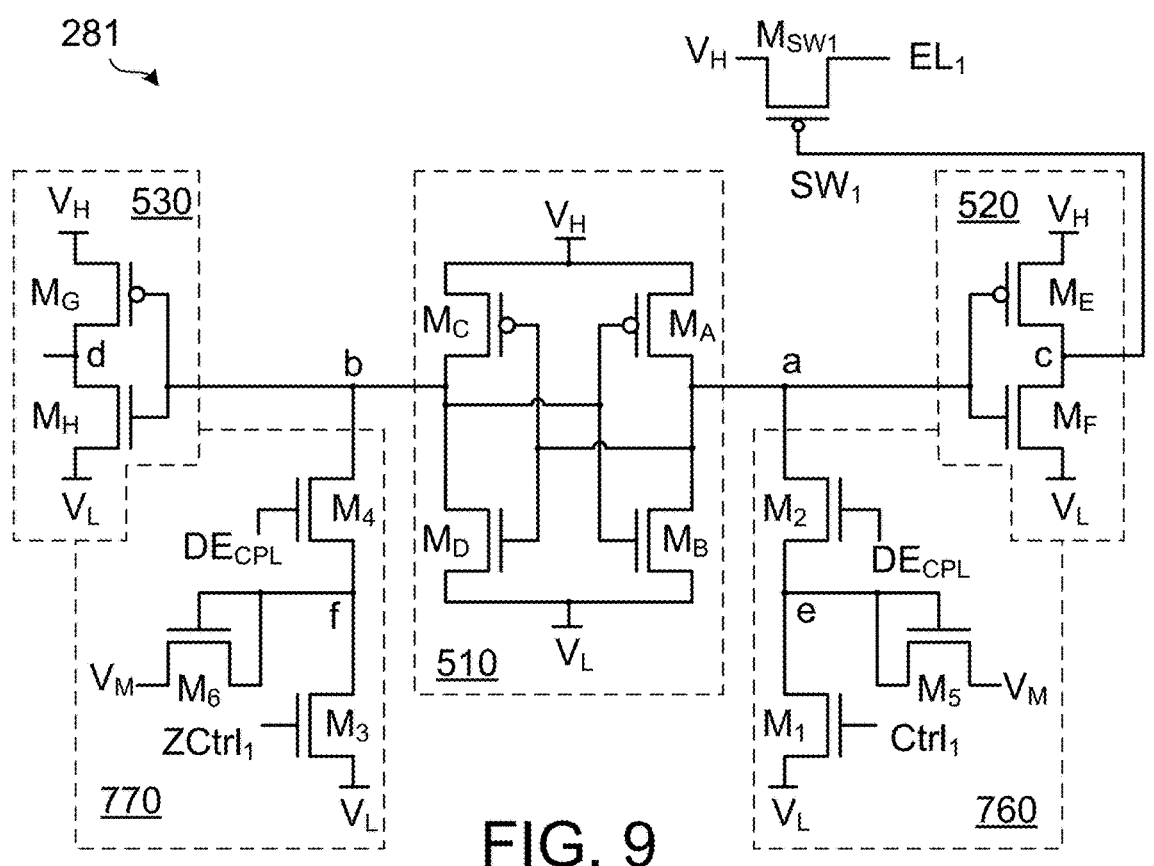
FIG. 9 is a schematic circuit diagram illustrating a switch controller according to a fifth embodiment of the present invention.

FIG. 9 is a schematic circuit diagram illustrating a switch controller 281 according to a fifth embodiment of the present invention. In comparison with the fourth embodiment, the structures of the control stages 760 and 770 in the fifth embodiment are distinguished. The control stage 760 further comprises a diode-connected transistor $M_5$. The control stage 770 further comprises a diode-connected transistor $M_6$. The operations of the switch controller 281 in the fifth embodiment are similar to the operations of the switch controller 281 in the fourth embodiment, and therefore are not redundantly described herein. For brevity, only the structures of the control stages 760 and 770 will be described as follows.

In the control stage 760, the drain terminal of the transistor $M_5$ receives the medium voltage $V_M$, the gate terminal of the transistor $M_5$ is connected with the node e, and the source terminal of the transistor $M_5$ is connected with the node e. In the control stage 770, the drain terminal of the transistor $M_6$ receives the medium voltage $V_M$, the gate terminal of the transistor $M_6$ is connected with the node f, and the source terminal of the transistor $M_6$ is connected with the node f. When the transistor $M_1$ of the control stage 760 is turned off in the erase phase $PH_{ERS}$, the node e is floating and may be coupled to a high voltage. When the node e is coupled to the high voltage, the transistor $M_5$ will be turned on and the voltage at the node e will be equal to the medium voltage $V_M$ minus the threshold voltage $V_{TH5}$ of the transistor $M_5$, i.e., ($V_M$-$V_{TH5}$). For example, in case that the medium voltage $V_M$ is 1.2 V and the threshold voltage $V_{TH5}$ of the transistor $M_5$ is 0.5 V, the voltage at the node e is 0.7 V. Similarly, when the transistor $M_3$ of the control stage 770 is turned off in the erase phase $PH_{ERS}$, the voltage at the node f is equal to the medium voltage $V_M$ minus the threshold voltage $V_{TH6}$ of the transistor $M_6$ (i.e., ($V_M$-VTH). For example, in case that the medium voltage $V_M$ is 1.2 V and the threshold voltage $V_{TH6}$ of transistor $M_6$ is 0.5 V, the voltage at the node f is 0.7 V.

Similarly, in the switch controller 281 of the third embodiment shown in FIG. 5, the control stage 540 may be additionally equipped with a first diode-connected transistor, and the control stage 550 may be additionally equipped with a second diode-connected transistor. The first diode-connected transistor is connected with the node e to discharge the node e when the node e is coupled to the high voltage. The second diode-connected transistor is connected with the node f to discharge the node f when the node f is coupled to the high voltage.

The voltage source 262 in the power supplying circuit 260 may be implemented with a charge pump and a voltage selector. The concept of this voltage source 262 can be applied to the switch controller of the fourth embodiment and the switch controller of the fifth embodiment.

Figure 10:
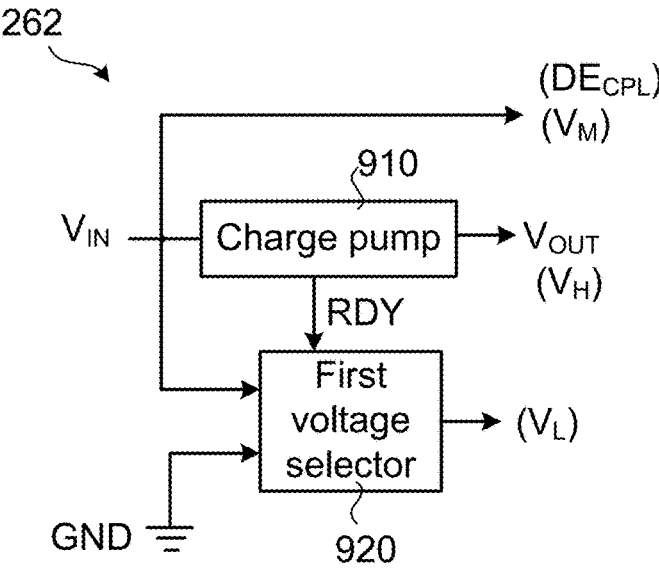
FIG. 10 is a schematic circuit diagram illustrating the voltage source in the power supplying circuit.

FIG. 10 is a schematic circuit diagram illustrating the voltage source 262 in the power supplying circuit 260. As shown in FIG. 10, the voltage source 262 comprises a charge pump 910 and a first voltage selector 920. The input voltage VIN of the charge pump 910 can be used as the decoupling signal $DE_{CPL}$ in the fourth embodiment, or as both the decoupling signal $DE_{CPL}$ and the medium voltage $V_M$ to be outputted from the voltage source 262 in the fifth embodiment. The output voltage $V_{OUT}$ of the charge pump 910 can be used as the high voltage $V_H$ to be outputted from the voltage source 262. In addition, the medium voltage $V_M$ is also served as the decoupling signal $DE_{CPL}$.

For example, before voltage boost function of the charge pump 910 is enabled, the input voltage VIN of the charge pump 910 is equal to the output voltage $V_{OUT}$. When the voltage boost function of the charge pump 910 is enabled and operated normally, the input voltage VIN is boosted two times to be the output voltage $V_{OUT}$ by the charge pump 910. Moreover, when the output voltage $V_{OUT}$ from the charge pump 910 reaches the highest voltage value, the charge pump 910 activates a ready signal RDY to indicate that the output voltage $V_{OUT}$ from the charge pump 910 reaches the highest voltage value. In this embodiment, the highest voltage value of the output voltage $V_{OUT}$ from the charge pump 910 is the erase voltage $V_{EE}$, i.e., 16 V.

The two input terminals of the first voltage selector 920 receive the input voltage VIN and the ground voltage (0 V), respectively. The select terminal of the first voltage selector 920 receives the ready signal RDY. In case that the ready signal RDY is not activated, the first voltage selector 920 selects the ground voltage (0 V) as the low voltage $V_L$. In case that the ready signal RDY is activated, the first voltage selector 920 selects the input voltage VIN as the low voltage $V_L$.

When the non-volatile memory 100 performs a sector erase, the power supplying circuit 260 will sequentially enter a logic phase $PH_{LOGIC}$, a transition phase $PH_{TRN}$ and an erase phase $PH_{ERS}$. In the logic phase $PH_{LOGIC}$, the input voltage VIN received by the voltage source 262 is the logic supply voltage $V_{DD}$ (e.g., 1.2 V). Since the charge pump 910 is not enabled, the ready signal RDY is not activated, and the first voltage selector 920 outputs the ground voltage (0 V). Consequently, the high voltage $V_H$ outputted from the voltage source 262 is equal to the logic supply voltage $V_{DD}$, the decoupling signal $DE_{CPL}$ and/or the medium voltage $V_M$ is equal to the logic supply voltage $V_{DD}$, and the low voltage $V_L$ is equal to the ground voltage (0 V).

In the transition phase $PH_{TRN}$, the input voltage VIN received by the voltage source 262 is 4 V (i.e., $V_{EE}/4$). Since the charge pump 910 is enabled, the output voltage $V_{OUT}$ from the charge pump 910 is 8 V (i.e., $V_{EE}/2$). In addition, the ready signal RDY is not activated, and the first voltage selector 920 outputs the ground voltage (0 V). Consequently, the high voltage $V_H$ outputted from the voltage source 262 is 8 V (i.e., $V_{EE}/2$), the decoupling signal $DE_{CPL}$ and/or the medium voltage $V_M$ is 4 V (i.e., $V_{EE}/4$), and the low voltage $V_L$ is equal to the ground voltage (0 V).

In the erase phase $PH_{ERS}$, the input voltage VIN received by the voltage source 262 is 8 V (i.e., $V_{EE}/2$). Since the charge pump 910 is enabled, the output voltage $V_{OUT}$ from the charge pump 910 is 16 V (i.e., $V_{EE}$), the ready signal RDY is activated, and the voltage outputted from the first voltage selector 920 is 8 V. Consequently, the high voltage $V_H$ outputted from the voltage source 262 is 16 V (i.e., $V_{EE}$), the decoupling signal $DE_{CPL}$ and/or the medium voltage $V_M$ is 8 V (i.e., $V_{EE}/2$), and the low voltage $V_L$ is 8 V (i.e., $V_{EE}/2$).

Accordingly, the medium voltage $V_M$ outputted from voltage source 262 may be used as the decoupling signal $DE_{CPL}$ and applied to the switch controller of the fourth embodiment and the switch controller of the fifth embodiment. In another embodiment, the voltage source 262 is modified to be applied to the switch controller of the third embodiment, which has the medium voltage $V_M$ and the decoupling signal $DE_{CPL}$ of different values.

For example, the voltage source 262 is further equipped with a second voltage selector (not shown). The second voltage selector receives the ground voltage (0V) and the output voltage $V_{OUT}$. In the logic phase $PH_{LOGIC}$, the ground voltage (0V) outputted from the second voltage selector is served as the decoupling signal $DE_{CPL}$. In the transition phase $PH_{TRN}$, the voltage of 8V is outputted from the second voltage selector and served as the decoupling signal $DE_{CPL}$. In the erase phase $PH_{ERS}$, the voltage of 16V is outputted from the second voltage selector and served as the decoupling signal $DE_{CPL}$.

It is noted that the magnitudes of the high voltage $V_H$, the medium voltage $V_M$, the low voltage $V_L$ and the decoupling signal $DE_{CPL}$ are not restricted. That is, the voltage source may be designed according to the practical requirements. The magnitudes of the high voltage $V_H$, the medium voltage $V_M$ and the low voltage $V_L$ may be determined according to the erase voltage $V_{EE}$ and the maximum voltage stress that the switching transistors $M_{SW1} \sim M_{SWX}$ and the switch controllers $281 \sim 28X$ can withstand.

Take the switch controller 281 of the fifth embodiment for example. It is assumed that the erase voltage $V_{EE}$ is 13 V and the maximum voltage stress capable of being withstood by the switching transistors is 7 V. In the logic phase $PH_{LOGIC}$, the high voltage $V_H$ is equal to the logic supply voltage $V_{DD}$ (e.g., 1.2 V), the low voltage $V_L$ is equal to 0 V, and the medium voltage $V_M$ and the decoupling signal $DE_{CPL}$ are in the range of the high voltage $V_H$ and the low voltage $V_L$. The magnitude of the medium voltage $V_M$ is not restricted as long as the transistor $M_5$ and the transistor $M_6$ can be turned on.) For example, the medium voltage $V_M$ is 1 V.

In the transition phase $PH_{TRN}$, the high voltage $V_H$ can be set to be slightly less than the maximum stress that the transistor can withstand. The medium voltage $V_M$ and the decoupling signal $DE_{CPL}$ are lower than the high voltage $V_H$. The medium voltage $V_M$ and the decoupling signal $DE_{CPL}$ are higher than the low voltage $V_L$. For example, the high voltage $V_H$ is set to 7 V, the medium voltage $V_M$ and the decoupling signal $DE_{CPL}$ are set to 4 V, and the low voltage $V_L$ is set to 0 V.

In the erase phase $PH_{ERS}$, the high voltage $V_H$ is set to the erase voltage $V_{EE}$. The medium voltage $V_M$ and the decoupling signal $DE_{CPL}$ are lower than the high voltage $V_H$. The medium voltage $V_M$ and the decoupling signal $DE_{CPL}$ are equal to the low voltage $V_L$. For example, the high voltage $V_H$ is set to 13 V (i.e., $V_{EE}$), the medium voltage $V_M$ and the decoupling signal $DE_{CPL}$ are set to 8 V, and the low voltage $V_L$ is set to 8 V.

From the above descriptions, the present invention provides a power supplying circuit and an associated switch controller for a non-volatile memory. When the sector erase is performed, the voltage stress withstood by the switching transistors in the power supplying circuit is lower than the maximum voltage stress. In addition, the voltage stress withstood by all transistors in the switch controller is lower than the maximum voltage stress. In other words, when the sector erase is performed, all switch controllers and all switching transistors in the power supplying circuit 260 can be operated normally within the SOA.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power supplying circuit for a non-volatile memory, the power supplying circuit comprising a voltage source and a switching circuit, the voltage source outputting a high voltage, a low voltage and a decoupling signal, the switching circuit comprising a power switch and a switch controller, a first terminal of the power switch receiving the high voltage, a second terminal of the power switch being coupled to an erase line of the non-volatile memory, the switch controller comprising:

a latch, wherein a first power terminal of the latch receives the high voltage, a second power terminal of the latch receives the low voltage, a first control terminal of the latch is connected with a first node, and a second control terminal of the latch is connected with a second node;

a first driving stage, wherein a first power terminal of the first driving stage receives the high voltage, a second power terminal of the first driving stage receives the low voltage, an input terminal of the first driving stage is connected with the first node, an output terminal of the first driving stage generates a switching signal to a control terminal of the power switch, and on/off states of the power switch are controlled according to the switching signal;

a first control stage connected with the first node, wherein the first control stage receives a control signal and the decoupling signal; and a second control stage connected with the second node, wherein the second control stage receives an inverted control signal and the decoupling signal, wherein in a logic phase of a sector erase, the high voltage is equal to a logic supply voltage, the low voltage is equal to a ground voltage, and the control signal is stored in the latch;

wherein in a transition phase of the sector erase, the high voltage rises from the logic supply voltage to a first voltage, the low voltage is equal to the ground voltage;

wherein in an erase phase of the sector erase, the high voltage rises from the first voltage to an erase voltage, the low voltage rises from the ground voltage to a second voltage, the erase voltage is higher than the second voltage, and the first driving stage generates the switching signal according to the high voltage and the low voltage;

wherein the decoupling signal is in a range of the high voltage and the low voltage during the logic phase, the transition phase and the erase phase.

2. The power supplying circuit as claimed in claim 1, wherein in the transition phase of the sector erase, the decoupling signal is activated, the first control stage is decoupled from the first node, and the second control stage is decoupled from the second node.

3. The power supplying circuit as claimed in claim 1, wherein the latch comprises:

a first inverter, wherein a first power terminal of the first inverter receives the high voltage, a second power terminal of the first inverter receives the low voltage, an input terminal of the first inverter is connected with the second node, and an output terminal of the first inverter is connected with the first node; and a second inverter, wherein a first power terminal of the second inverter receives the high voltage, a second power terminal of the second inverter receives the low voltage, an input terminal of the second inverter is connected with the first node, and an output terminal of the second inverter is connected with the second node.

4. The power supplying circuit as claimed in claim 3, wherein the first driving stage comprises a third inverter, wherein a first power terminal of the third inverter receives the high voltage, a second power terminal of the third inverter receives the low voltage, an input terminal of the third inverter is connected with the first node, and an output terminal of the third inverter generates the switching signal.

5. The power supplying circuit as claimed in claim 4, wherein the power supplying circuit further comprises a second driving stage, wherein a first power terminal of the second driving stage receives the high voltage, a second power terminal of the second driving stage receives the low voltage, and an input terminal of the second driving stage is connected with the second node.

6. The power supplying circuit as claimed in claim 1, wherein the voltage source further outputs a medium voltage, the medium voltage is in the range of the high voltage and the low voltage during the logic phase, the transition phase and the erase phase, the first control stage comprises:

a first transistor, wherein a source terminal of the first transistor receives the medium voltage, a gate terminal of the first transistor receives the control signal, and a drain terminal of the first transistor is connected with a third node; and a second transistor, wherein a source terminal of the second transistor is connected with the third node, a gate terminal of the second transistor receives the decoupling signal, and a drain terminal of the second transistor is connected with the first node.

7. The power supplying circuit as claimed in claim 6, wherein the second control stage comprises:

a third transistor, wherein a source terminal of the third transistor receives the medium voltage, a gate terminal of the third transistor receives the inverted control signal, and a drain terminal of the third transistor is connected with a fourth node; and a second transistor, wherein a source terminal of the fourth transistor is connected to the fourth node, a gate terminal of the fourth transistor receives the decoupling signal, and a drain terminal of the fourth transistor is connected with the second node.

8. The power supplying circuit as claimed in claim 7, wherein in the logic phase, the high voltage outputted from the voltage source is equal to the logic supply voltage, the medium voltage outputted from the voltage source is equal to the logic supply voltage, the low voltage outputted from the voltage source is equal to the ground voltage, and the decoupling signal is equal to the ground voltage.

9. The power supplying circuit as claimed in claim 8, wherein in the transition phase, the high voltage outputted from the voltage source is equal to a half of the erase voltage, the medium voltage outputted from the voltage source is equal to one-quarter of the erase voltage, the low voltage outputted from the voltage source is equal to the ground voltage, and the decoupling signal is equal to a half of the erase voltage.

10. The power supplying circuit as claimed in claim 9, wherein in the erase phase, the high voltage outputted from the voltage source is equal to the erase voltage, the medium voltage outputted from the voltage source is equal to a half of the erase voltage, the low voltage outputted from the voltage source is equal to a half of the erase voltage, and the decoupling signal is equal to the erase voltage.

11. The power supplying circuit as claimed in claim 1, wherein the first control stage comprises:

a first transistor, wherein a source terminal of the first transistor receives the low voltage, a gate terminal of the first transistor receives the control signal, and a drain terminal of the first transistor is connected with a third node; and a second transistor, wherein a source terminal of the second transistor is connected with the third node, a gate terminal of the second transistor in receives the decoupling signal, and a drain terminal of the second transistor is connected with the first node.

12. The power supplying circuit as claimed in claim 11, wherein the second control stage comprises:

a third transistor, wherein a source terminal of the third transistor receives the low voltage, a gate terminal of the third transistor receives the inverted control signal, and a drain terminal of the third transistor is connected with a fourth node; and a fourth transistor, wherein a source terminal of the fourth transistor is connected to the fourth node, a gate terminal of the fourth transistor receives the decoupling signal, and a drain terminal of the fourth transistor is connected with the second node.

13. The power supplying circuit as claimed in claim 12, wherein the voltage source further outputs a medium voltage, the medium voltage is in the range of the high voltage and the low voltage during the logic phase, the transition phase and the erase phase, the first control stage further comprises a fifth transistor, the second control stage further comprises a sixth transistor, a drain terminal of the fifth transistor receives the medium voltage, a gate terminal of the fifth transistor is connected with the third node, a source terminal of the fifth transistor is connected with the third node, a drain terminal of the sixth transistor receives the medium voltage, a gate terminal of the sixth transistor is connected with the fourth node, and a source terminal of the sixth transistor is connected with the fourth node.

14. The power supplying circuit as claimed in claim 12, wherein in the logic phase, the high voltage outputted from the voltage source is equal to the logic supply voltage, the medium voltage outputted from the voltage source is equal to the logic supply voltage, and the low voltage outputted from the voltage source is equal to the ground voltage, wherein the decoupling signal is equal to the medium voltage.

15. The power supplying circuit as claimed in claim 14, wherein in the transition phase, the high voltage outputted from the voltage source is equal to a half of the erase voltage, the medium voltage outputted from the voltage source is equal to one-quarter of the erase voltage, and the low voltage outputted from the voltage source is equal to the ground voltage.

16. The power supplying circuit as claimed in claim 15, wherein in the erase phase, the high voltage outputted from the voltage source is equal to the erase voltage, the medium voltage outputted from the voltage source is equal to a half of the erase voltage, and the low voltage outputted from the voltage source is equal to a half of the erase voltage.

17. The power supplying circuit as claimed in claim 1, wherein the latch comprises:

a first transistor, wherein a source terminal of the first transistor receives the high voltage, a gate terminal of the first transistor is connected with the second node, and a drain terminal of the first transistor is connected with the first node;

a second transistor, wherein a source terminal of the second transistor receives the low voltage, a gate terminal of the second transistor is connected with the second node, and a drain terminal of the second transistor is connected with the first node;

a third transistor, wherein a source terminal of the third transistor receives the high voltage, a gate terminal of the third transistor is connected with the first node, and a drain terminal of the third transistor is connected with the second node; and a fourth transistor, wherein a source terminal of the fourth transistor receives the low voltage, a gate terminal of the fourth transistor is connected with the first node, and a drain terminal of the fourth transistor is connected with the second node.

18. The power supplying circuit as claimed in claim 17, wherein the first driving stage comprises:

a fifth transistor, wherein a source terminal of the fifth transistor receives the high voltage, a gate terminal of the fifth transistor is connected with the first node, and a drain terminal of the fifth transistor is connected with a fifth node;

a sixth transistor, wherein a source terminal of the sixth transistor receives the low voltage, a gate terminal of the sixth transistor is connected with the first node, and a drain terminal of the sixth transistor is connected with the fifth node, wherein the fifth node is the output terminal of the first driving stage.

19. The power supplying circuit as claimed in claim 17, wherein the power supplying circuit further comprises a second driving stage, and the second driving stage comprises:

a seventh transistor, wherein a source terminal of the seventh transistor receives the high voltage, a gate terminal of the seventh transistor is connected with the second node, and a drain terminal of the seventh transistor is connected with a sixth node; and an eighth transistor, wherein a source terminal of the eighth transistor receives the low voltage, a gate terminal of the eighth transistor is connected with the second node, and a drain terminal of the eighth transistor is connected with the sixth node.

20. The power supplying circuit as claimed in claim 1, wherein in response to the control signal of a first logic level, the power switch is turned on according to the switching signal to transmit the logic supply voltage, the first voltage and the erase voltage to the erase line respectively in the logic phase, the transition phase and the erase phase.

21. The power supplying circuit as claimed in claim 20, wherein in response to the control signal of a second logic level, the power switch is turned off according to the switching signal in the logic phase, the transition phase and the erase phase.

22. A power supplying circuit for a non-volatile memory, wherein the power supplying circuit comprises a power switch, a switch controller and a voltage source, the voltage source is configured to output a high voltage, a low voltage and a decoupling signal, a first terminal of the power switch is configured to receive the high voltage, a second terminal of the power switch is coupled to an erase line of the non-volatile memory, the switch controller is configured to receive the high voltage, the low voltage and the decoupling signal and the switch controller comprises:

a latch, wherein a first control terminal of the latch is coupled to a first node, and a second control terminal of the latch is coupled to a second node;

a first driving stage coupled to the first node and a control terminal of the power switch, and configured to output the high voltage or the low voltage as a switching signal to the control terminal of the power switch according to a voltage at the first node;

a first control stage coupled to the first node, and configured to control the voltage at the first node according to a control signal and the decoupling signal; and a second control stage coupled to the second node, and configured to control a voltage at the second node according to an inverted control signal and the decoupling signal, wherein the high voltage, the low voltage and the decoupling signal are increased in a multi-step manner during a sector erase of the non-volatile memory, wherein the decoupling signal is in a range of the high voltage and the low voltage during the sector erase.

* * * * *